US012666883B2

(12) United States Patent
Hsieh et al.

(10) Patent No.: US 12,666,883 B2
(45) Date of Patent: Jun. 23, 2026

(54) DIRECT NON-OHMIC SWITCH FOR VOLTAGE INSTABILITY PROTECTION AND METHODS FOR FORMING THE SAME

(71) Applicant: Taiwan Semiconductor Manufacturing Company Limited, Hsinchu (TW)

(72) Inventors: Wei Ting Hsieh, Hsinchu (TW); Kuo-Ching Huang, Hsinchu City (TW); Yu-Wei Ting, Taipei City (TW); Ching-En Chen, Chiayi City (TW); Kuo-Pin Chang, Zhubei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 408 days.

(21) Appl. No.: 18/317,268

(22) Filed: May 15, 2023

(65) Prior Publication Data

US 2024/0389487 A1 Nov. 21, 2024

(51) Int. Cl.
H10N 79/00 (2023.01)

(52) U.S. Cl.
CPC .................................. H10N 79/00 (2023.02)

(58) Field of Classification Search
CPC .... H10N 79/00; H10N 70/20; H10N 70/8828; H10W 90/00
USPC .......................................................... 257/4
See application file for complete search history.

(56) References Cited

U.S. PATENT DOCUMENTS

| | | | |
|---|---|---|---|
| 2006/0046509 A1* | 3/2006 | Gwan-Hyeob | .... H10N 70/8828 438/758 |
| 2008/0042118 A1* | 2/2008 | Hayakawa | ........... H10N 70/841 257/E47.001 |

| | | | |
|---|---|---|---|
| 2015/0200362 A1* | 7/2015 | Jo | ........................ H10N 70/011 257/3 |
| 2017/0141159 A1* | 5/2017 | Kim | ...................... G06F 3/0656 |
| 2018/0301626 A1* | 10/2018 | Trinh | ................... H10N 70/841 |
| 2020/0066695 A1 | 2/2020 | Slovin et al. | |
| 2020/0388753 A1* | 12/2020 | Karpov | ............. G11C 13/0097 |
| 2021/0135100 A1 | 5/2021 | Slovin et al. | |
| 2021/0280637 A1* | 9/2021 | Taddiken | ............. H10N 70/823 |
| 2021/0305508 A1* | 9/2021 | Lee | .................... H10N 70/8828 |

(Continued)

FOREIGN PATENT DOCUMENTS

TW 200723508 A 6/2007

OTHER PUBLICATIONS

Jianq Chyun Intellectual Property Office; TW Application No. 112125684; Office Action mailed Jun. 11, 2024; 10 pages.

*Primary Examiner* — Dzung Tran

(74) *Attorney, Agent, or Firm* — The Marbury Law Group, PLLC

(57) ABSTRACT

A device structure includes semiconductor devices located on a substrate; metal interconnect structures located in dielectric material layers overlying the semiconductor devices; and a non-Ohmic voltage-triggered switch including a first switch electrode that is electrically connected to one of the semiconductor devices through a subset of the metal interconnect structures, a second switch electrode, and a non-Ohmic switching material portion providing a non-Ohmic current-voltage characteristics and in contact with the first switch electrode and the second switch electrode. The non-Ohmic voltage-triggered switch may be used as an electrostatic discharge (ESD) switch.

20 Claims, 29 Drawing Sheets

(56) References Cited

U.S. PATENT DOCUMENTS

| 2022/0037399 | A1 | 2/2022 | Lin et al. |
| 2023/0065500 | A1 | 3/2023 | Lin et al. |

* cited by examiner

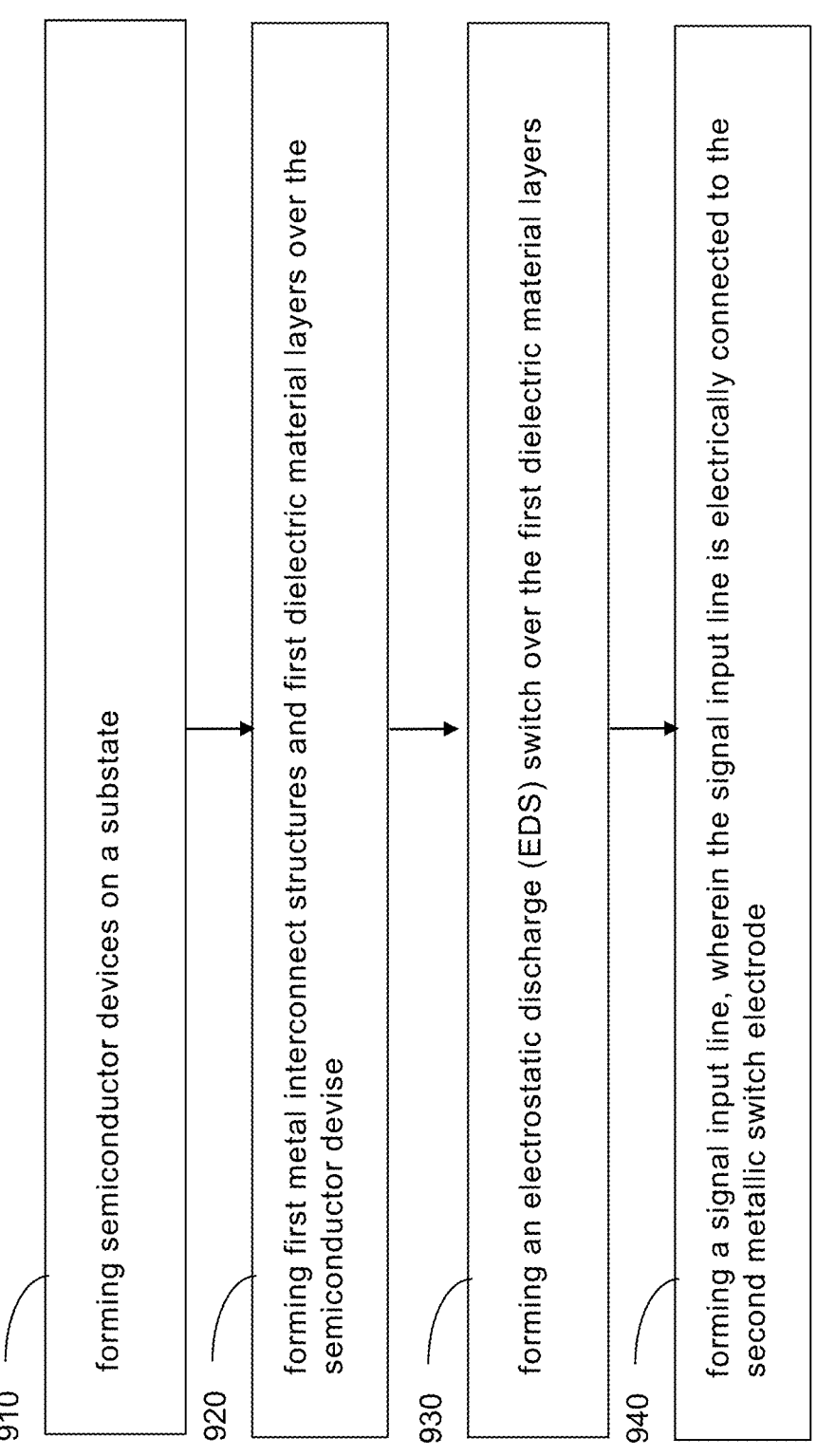

910  forming semiconductor devices on a substate 920  forming first metal interconnect structures and first dielectric material layers over the semiconductor devise 930  forming an electrostatic discharge (EDS) switch over the first dielectric material layers 940  forming a signal input line, wherein the signal input line is electrically connected to the second metallic switch electrode

FIG. 9

DIRECT NON-OHMIC SWITCH FOR VOLTAGE INSTABILITY PROTECTION AND METHODS FOR FORMING THE SAME

BACKGROUND

Temporary voltage instabilities, such as electrostatic discharge (ESD) and potential-induced degradation (PID), are transient voltage changes that may damage devices and adversely impact circuit performance. Suitable protection from such temporary voltage instabilities is desired to safeguard semiconductor devices from irreversible damages during operation of a semiconductor circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart that illustrates general processing steps for manufacturing a device structure according to an embodiment of the present disclosure.

DETAILED DESCRIPTION

Figure 1A:
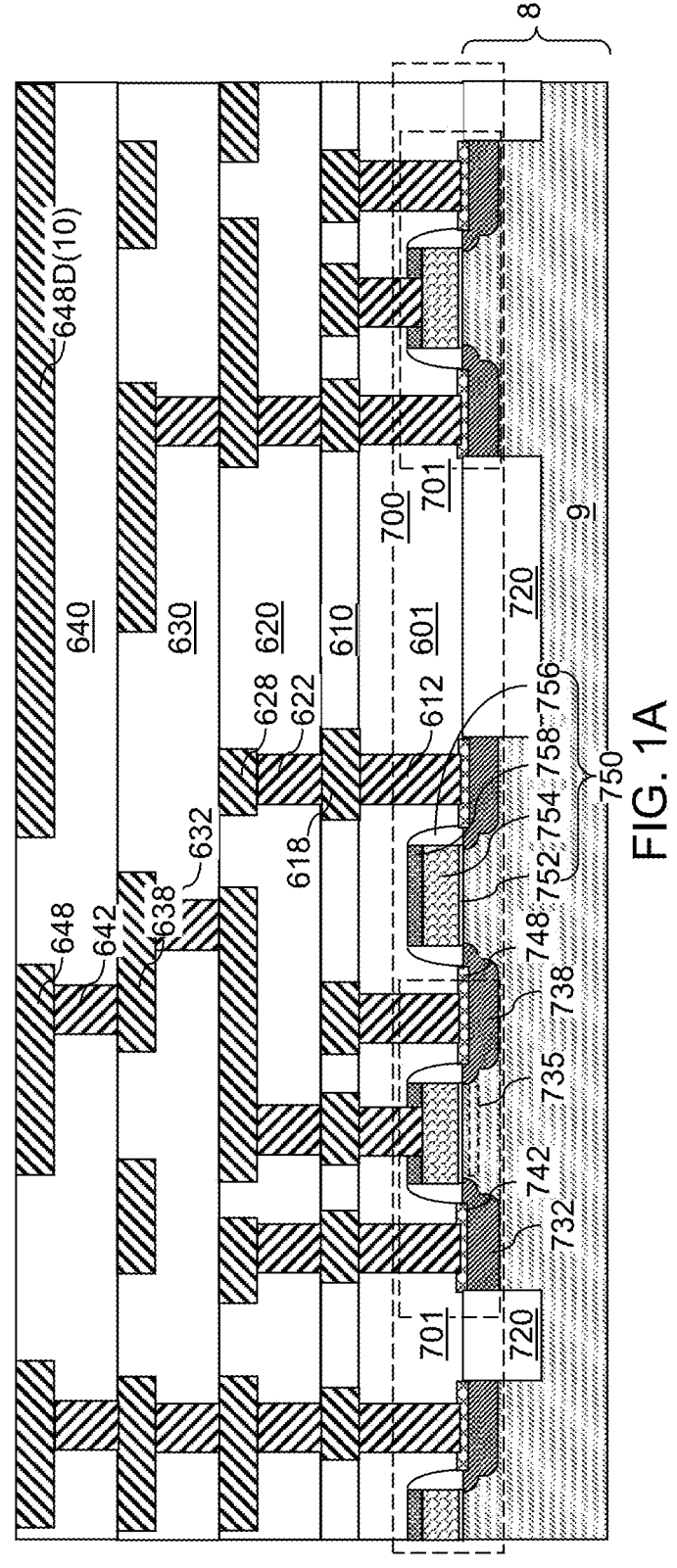
FIGS. 1A-1F are sequential vertical cross-sectional views of a first structure during formation of a device structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Embodiments of the present disclosure are related to direct non-Ohmic switches that provide protection from voltage instability, such as transient voltage spikes, during operation of semiconductor devices. Specifically, various embodiment direct non-Ohmic switches disclosed herein may use a non-Ohmic switching material such as a phase change material or an ovonic switching material that forms a conductive path upon application of a voltage pulse having a magnitude that exceeds a threshold voltage. Various embodiment direct non-Ohmic switches disclosed herein may be formed directly between a signal input and a current discharge path within a metal interconnect level. Thus, various embodiment direct non-Ohmic switches disclosed herein do not use any control device such as a field effect transistor, and thus, do not use any semiconductor channel or a p-n junction. Various embodiment direct non-Ohmic switches disclosed herein may comprise a first metallic material portion, a non-Ohmic switch material portion in direct contact with the first metallic material portion, and a second metallic material portion in direct contact with the non-Ohmic switch material portion. The non-Ohmic switch material portion may be formed within a metal interconnect level, and may comprise a via structure, as a via liner structure, a plate contacting conductive lines, a plate contacting at least one self-aligned plated material portion, a via structure contacting sidewalls of conductive lines, or a via structure contacting at least one self-aligned plated material portion. The various embodiments of the present disclosure are now described with reference to accompanying drawings.

Referring to FIG. 1A, a first embodiment structure of the present disclosure is illustrated. The first embodiment structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Semiconductor devices 701 such as field effect transistors may be formed over the top surface of the semiconductor material layer 9. For example, each field effect transistor may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor circuits, etc.), and are collectively referred to as CMOS circuitry 700.

One or more of the field effect transistors in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor in the CMOS circuitry 700 may include a single crystalline semiconductor channel such as a single crystalline silicon channel. In one embodiment, a subset of the field effect transistors in the CMOS circuitry 700 may include a respective node that is subsequently electrically connected to a node of an energy harvesting device and/or to a battery structure to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first conductive line structures 618 formed in the first interconnect-level dielectric material layer 610, first conductive via structures 622 formed in a lower portion of the second interconnect-level dielectric material layer 620, second conductive line structures 628 formed in an upper portion of the second interconnect-level dielectric material layer 620, second conductive via structures 632 formed in a lower portion of the third interconnect-level dielectric material layer 630, third conductive line structures 638 formed in an upper portion of the third interconnect-level dielectric material layer 630, third conductive via structures 642 formed in a lower portion of the fourth interconnect-level dielectric material layer 640, and fourth conductive line structures 648 formed in an upper portion of the fourth interconnect-level dielectric material layer 640. While the present disclosure is described using an embodiment in which four levels conductive line structures are formed in dielectric material layers, embodiments are expressly contemplated herein in which a lesser or greater number of levels of conductive line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first conductive via structures 622 and the second conductive line structures 628 may be formed as integrated line and via structures by a dual damascene process. Generally, any contiguous set of a conductive line structure (628, 638, 648) and at least one underlying conductive via structure (622, 632, 642) may be formed as an integrated line and via structure.

Generally, semiconductor devices 701 may be formed on a substrate 8, and metal interconnect structures (612, 618, 622, 628, 631, 638, 642, 648) and dielectric material layers (601, 610, 620, 630, 640) over the semiconductor devices 701. The metal interconnect structures (612, 618, 622, 628, 631, 638, 642, 648) may be formed in the dielectric material layers (601, 610, 620, 630, 640), and may be electrically connected to the semiconductor devices.

A subset of the metal interconnect structures located at a topmost level of the dielectric material layers (601, 610, 620, 630, 640) may comprise a switch electrode of a non-Ohmic voltage-triggered switch to be subsequently formed. For example, one of the fourth conductive line structures 648 may comprise a switch electrode, which is herein referred to as a second switch electrode 10. In one embodiment, the second switch electrode 10 may be an electrostatic discharge (ESD) line 648D configured to carry a high transient current during an electrostatic discharge event. In one embodiment, the second switch electrode 10 may be formed as a conductive line.

According to an aspect of the present disclosure, the second switch electrode 10 comprises a material that is resistant to electromigration and outdiffusion of material under external electrical bias voltage. For example, the second switch electrode 10 may comprise, and/or may consist essentially of, at least one metallic barrier material, at least one refractory metal, a high conductivity metal, a conductive metal oxide, a heavily doped semiconductor material, alloys or compounds thereof, and/or a layer stack thereof. Non-limiting exemplary metallic barrier materials that may be used for the second switch electrode 10 include TiN, TaN, WN, MoN, TiC, TaC, WC, etc. Refractory metals include W, Ta, Re, Mo, and Nb. Non-limiting examples of high conductivity metal comprise Os, Ir, Pt, Au, Pd, Ni, Al, Ti, etc. A non-limiting example of a conductive metal oxide is iridium oxide ($IrO_2$). Non-limiting examples of heavily doped semiconductor materials include heavily p-doped polysilicon, heavily n-doped polysilicon, a heavily doped silicon-germanium alloy, etc. As used herein, a heavily doped semiconductor material refers to a semiconductor material including electrical dopants at an atomic concentration greater than $1.0 \times 10^{20}/cm^3$.

In some embodiments, the second switch electrode 10 may, or may not, comprise a lower portion composed of copper or aluminum. In one embodiment, fourth conductive line structures 648 other than the second switch electrode 10 may comprise copper or aluminum, and the second switch electrode 10 may comprise a lower portion composed of copper or aluminum. In one embodiment, the second switch electrode 10 may comprise an upper portion including a conductive material that is different from copper or aluminum. In this embodiment, the fourth conductive line structures 648 other than the second switch electrode 10 may, or may not, comprise the conductive material of the upper portions of the second switch electrode 10. In one embodiment, the second switch electrode 10 may comprise, and/or may consist essentially of, a conductive material that is different from copper or aluminum, and the fourth conductive line structures 648 other than the second switch electrode 10 may comprise a different material than the conductive material of the second switch electrode 10. In one embodiment, the fourth conductive line structures 648 other than the second switch electrode 10 may comprise copper and/or aluminum, and the second switch electrode 10 may be free of copper and/or aluminum.

The height of the second switch electrode 10 may be in a range from 30 nm to 500 nm, such as from 50 nm to 300 nm, although lesser and greater thicknesses may also be used. In one embodiment, the top surface of second switch electrode 10 may be located within the horizontal plane including the top surface of the fourth interconnect-level dielectric material layer 640.

Figure 1B:
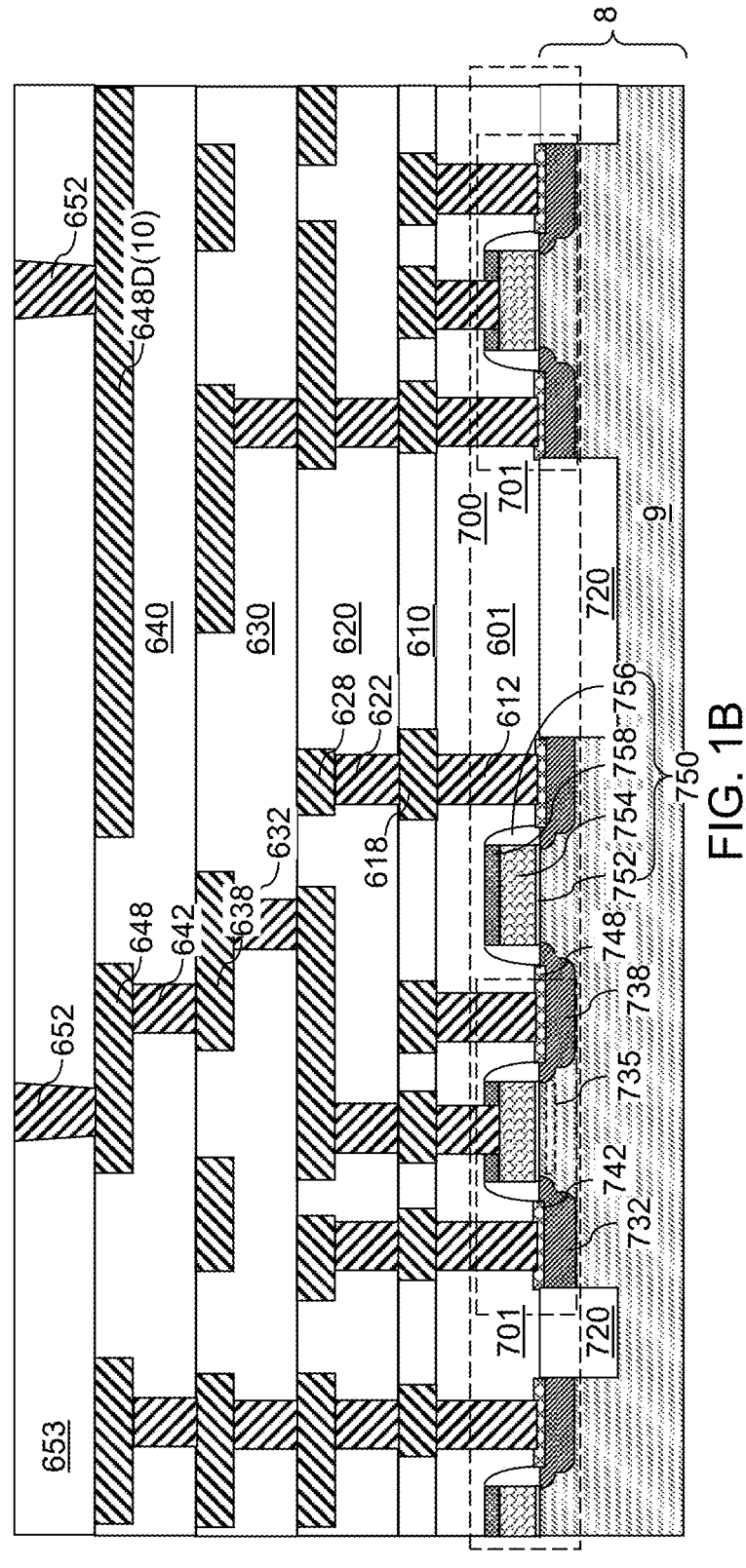

Referring to FIG. 1B, a via-level dielectric material layer 653 may be deposited over the fourth interconnect-level dielectric material layer 640. The via-level dielectric material layer 653 comprises a dielectric material such as undoped silicate glass, a doped silicate glass, silicon nitride, silicon carbide nitride, or a layer stack thereof. The via-level dielectric material layer 653 may be formed by a chemical vapor deposition. The thickness of the via-level dielectric material layer 653 may be in a range from 30 nm to 500 nm, such as from 60 nm to 300 nm, although lesser and greater thicknesses may also be used.

Via openings (not shown) may be formed through the via-level dielectric material layer 653 over a respective one of the fourth conductive line structures 648. At least one via opening may be formed over the second switch electrode 10. For example, a photoresist layer (not shown) may be applied over the via-level dielectric material layer 653, and may be lithographically patterned to form discrete openings therein. An anisotropic etch process may be performed to transfer the pattern of the openings in the photoresist layer through the via-level dielectric material layer 653. Each volume from which a portion of the via-level dielectric material layer 653 is removed constitutes a via opening. A top surface of a fourth conductive line structure 648 or the second switch electrode 10 may be physically exposed at the bottom of each via opening. The photoresist layer may be subsequently removed, for example, by ashing.

At least one conductive material, which may be at least one metallic material, may be deposited in the via openings. Excess portions of the at least one conductive material may be removed from above the horizontal plane including the top surface of the via-level dielectric material layer 653. Each remaining portion of the at least one conductive material filling a respective via opening constitutes a conductive via structure, which is herein referred to as a fourth conductive via structure 652. Each fourth conductive via structure 652 may contact a top surface of a fourth conductive line structure 648 or the second switch electrode 10. In one embodiment, each fourth conductive via structure 652 may comprise a metallic barrier liner and a metallic fill material portion. The metallic barrier liner may comprise a metallic barrier material such as TiN, TaN, WN, MoN, TiC, TaC, WC, or a combination thereof. The metallic fill material portion may comprise Cu, Al, Ru, W, Mo, Co, or a combination thereof. In one embodiment, the metallic fill material may comprise Cu or Al. Top surfaces of the fourth conductive via structures 652 may be formed within a horizontal plane including a top surface of the via-level dielectric material layer 653.

Figure 1C:
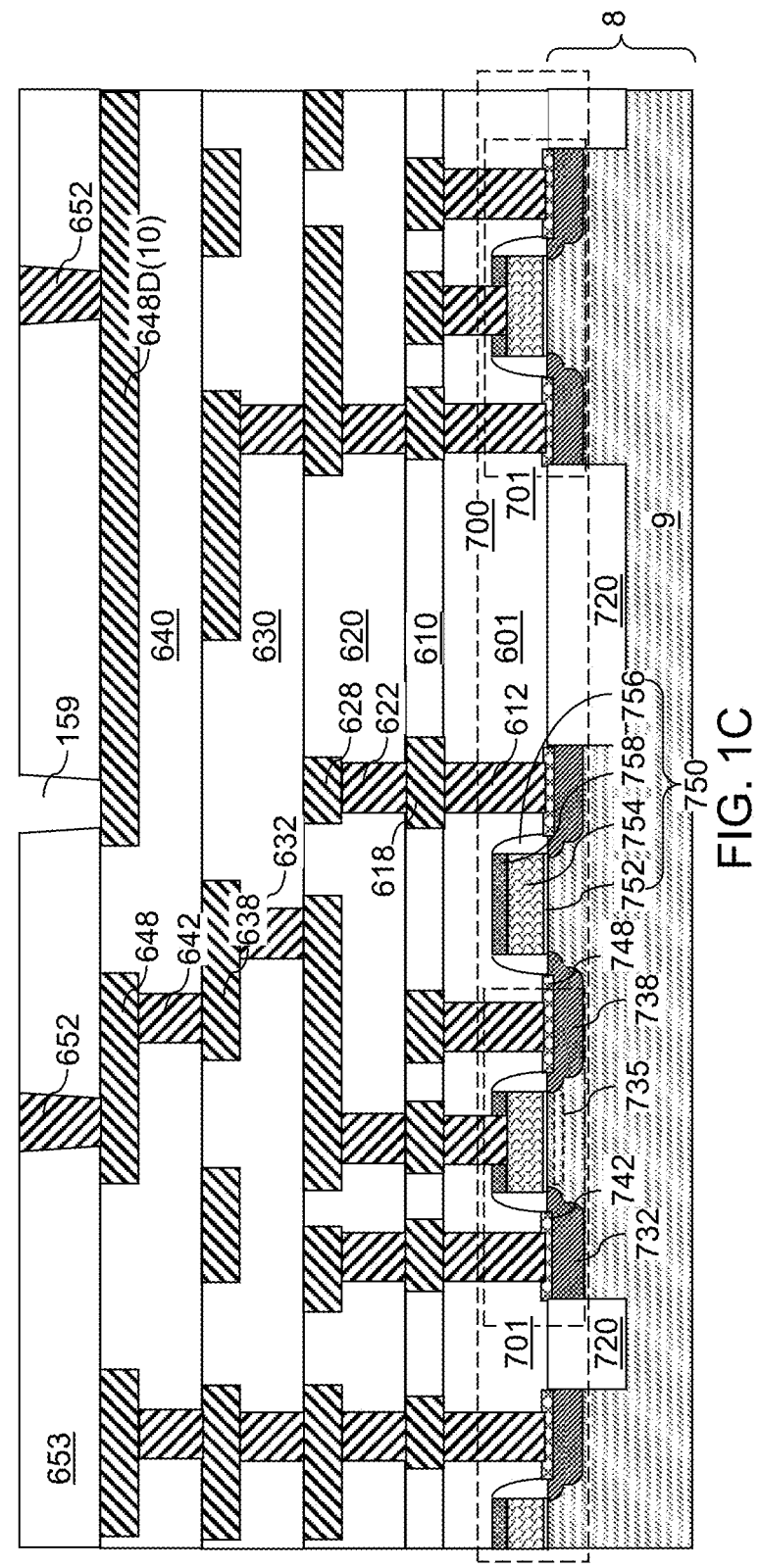

Referring to FIG. 1C, a photoresist layer (not shown) may be applied over the via-level dielectric material layer 653, and may be lithographically patterned to form a discrete opening therein. An anisotropic etch process may be performed to transfer the pattern of the opening in the photoresist layer through the via-level dielectric material layer 653. A volume from which a portion of the via-level dielectric material layer 653 is removed constitutes a via opening 159. A top surface of the second switch electrode 10 may be physically exposed at the bottom of the via opening 159. The photoresist layer may be subsequently removed, for example, by ashing.

Figure 1D:
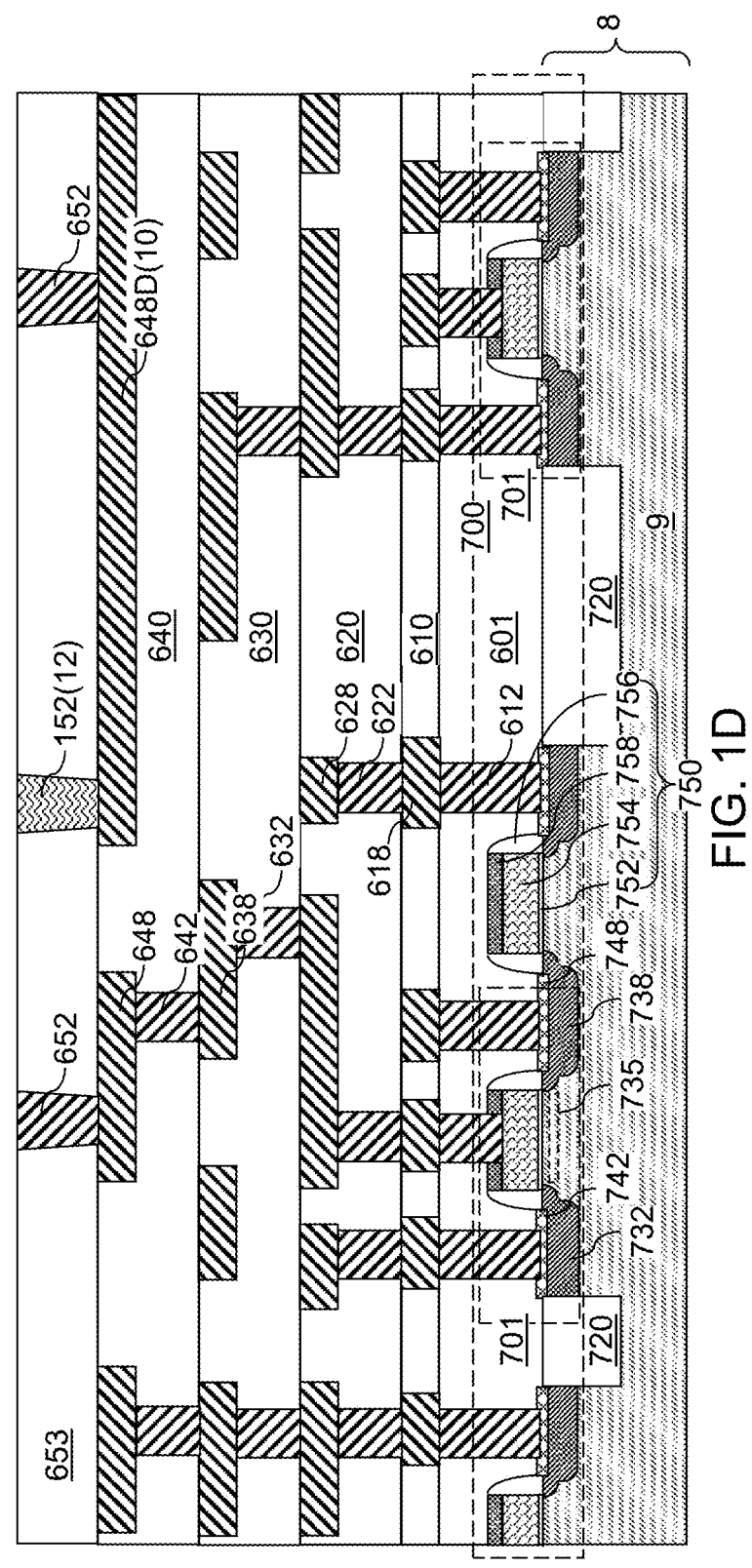

Referring to FIG. 1D, at least one non-Ohmic switching material may be deposited in the via opening 159, and excess portions of the at least one non-Ohmic switching material may be removed from outside the via opening 159, i.e., from above the horizontal plane including the top surface of the via-level dielectric material layer 653. As used herein, a non-Ohmic material refers to a material that exhibits nonlinear current characteristics as a function of an applied external voltage. As used herein, a non-Ohmic switching material refers to a non-Ohmic material that exhibits a higher effective resistivity (i.e., resistance divided by the distance and multiplied by the area) at a low applied voltage, and a low effective resistivity at a high applied voltage. The highest voltage at which the non-Ohmic switching material exhibits the higher effective resistivity is herein referred to as a critical voltage. Generally, a non-Ohmic switching material has an intrinsic critical electrical field at which the characteristics of the non-Ohmic switching material transitions from a high resistivity state to a low resistivity state as a function of an increasing external electrical field. The critical voltage is typically the product of the intrinsic critical electrical field and the thickness (or the dimension along the electrical field) of the non-Ohmic switching material.

A remaining portion of the at least one non-Ohmic switching material that fills the via opening 159 constitutes a non-Ohmic switching material portion 12, which is a non-Ohmic switching material via structure 152. The non-Ohmic switching material via structure 152 may be formed on a top surface of each of the second switch electrode 10. The non-Ohmic switching material portion 12 comprises, and/or consists essentially of, at least one non-Ohmic switching material. The non-Ohmic switching material portion 12 has a threshold voltages at which the electrical characteristics of the non-Ohmic switching material portion 12 makes a transition from an electrically non-conductive state to an electrically conductive state.

Generally, the non-Ohmic switching material portion 12 comprises, and/or consists essentially of, at least one ovonic threshold material and/or at least one phase change memory material.

In one embodiment, the non-Ohmic switching material portion 12 comprises, and/or consists essentially of, at least one ovonic threshold material such as a germanium-antimony-tellurium compound, a germanium-tellurium compound, a germanium-antimony compound, an antimony-tellurium compound, a germanium selenium compound, a germanium-selenium-nitrogen compound, a germanium-selenium-arsenic compound, a germanium-selenium-antimony compound, a silicon-tellurium compound, a zinc-tellurium compound, a carbon-tellurium compound, a boron-tellurium compound, a germanium-arsenic-tellurium compound, etc. The ovonic threshold material may, or may not, be doped with at least one dopant atom for enhancing the electrical characteristics such as the switching characteristics. The at least one dopant atom may comprise one or more of Si, N, O, Ni, Al, Ti, W, Cu, C, B, Sn, In, Ag, etc.

Alternatively or additionally, the non-Ohmic switching material portion 12 may comprise, and/or may consist essentially of, at least one phase change memory material. As used herein, a "phase change memory material" refers to a material having at least two different phases providing different resistivity. A phase change memory (PCM) material may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). Exemplary phase change memory materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. Generally, a phase change memory material may, or may not, be an ovonic threshold material, and an ovonic threshold material may, or may not, be a phase change memory material.

The top surfaces of the non-Ohmic switching material portion 12, comprising the non-Ohmic switching material via structure 152, may be formed within the horizontal plane including the top surface of the via-level dielectric material layer 653.

Figure 1E:
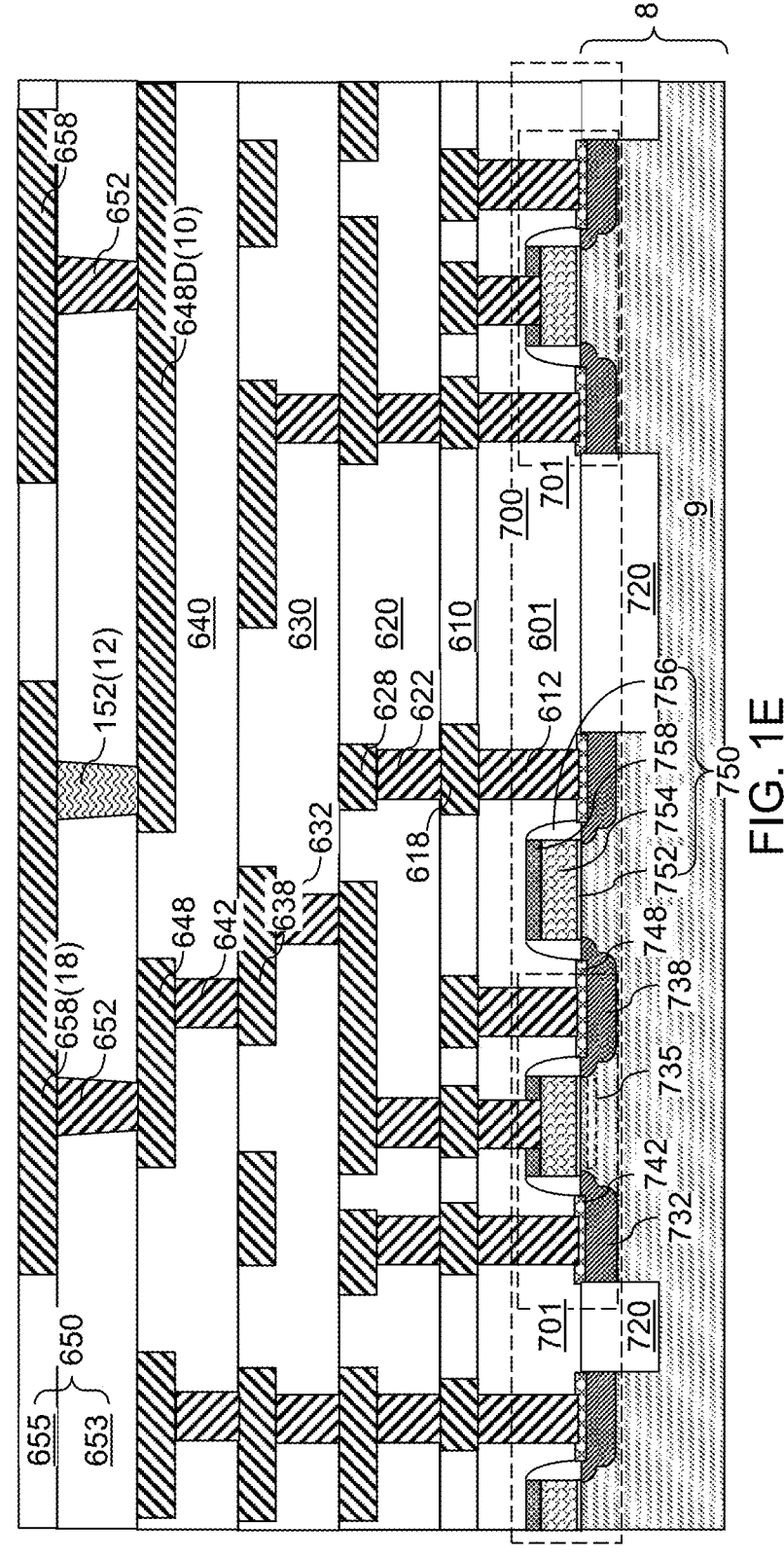

Referring to FIG. 1E, a line-level dielectric material layer 655 and fifth conductive line structures 658 may be formed over the via-level dielectric material layer 653. The combination of the via-level dielectric material layer 653 and the line-level dielectric material layer 655 is herein referred to as an interconnect-level dielectric layer, or as a fifth interconnect-level dielectric material layer 650. The fifth conductive line structures 658 are conductive line structures, such as metallic line structures, that are formed in the fifth interconnect-level dielectric material layer 650.

The fifth conductive line structures 658 may comprise a first subset of the fifth conductive line structures 658 that does not contact the non-Ohmic switching material portion 12 (comprising the non-Ohmic switching material via structure 152) and is used as metal interconnect lines for semiconductor devices 701, and a second subset of the fifth conductive line structures 658 that is used as a first switch electrode 18 and directly contact a top surface of the non-Ohmic switching material portion 12 and a top surface of at least one fourth conductive via structure 652. In one embodiment, one, a plurality, and/or each of the fifth conductive line structures 658 within the first subset of the fifth conductive line structures 658 may contact top surface of a respective fourth conductive via structure 652.

The first subset of the fifth conductive line structures 658 and the second subset of the fifth conductive line structures 658 may, or may not, comprise a same set of conductive materials. For example, the first subset of the fifth conductive line structures 658 may comprise copper-based metal portions and/or aluminum-based metal portions. The second subset of the fifth conductive line structures 658, which may comprise the first switch electrode 18, may comprise any material that may be used for the second switch electrode 10 as discussed above.

In one embodiment, the first switch electrode 18 may be electrically connected to at least one semiconductor device 701 located on the substrate 8. In one embodiment, a node of a semiconductor device 701 that is electrically connected to the first switch electrode 18 may comprise an input node of a semiconductor device 701 such as a gate electrode of a field effect transistor. In this embodiment, the electrically conductive path between the first switch electrode 18 and the input node of the semiconductor device 701 comprises an input signal path composed of metal interconnect structures.

Optionally, at least one of the fourth conductive via structures 652 and/or at least one of the fifth conductive line structures 658 may be electrically connected to the second switch electrode 10, which also functions as an electrostatic discharge line 648D, and may be used as components of an electrostatic discharge path.

According to an aspect of the present disclosure, the first switch electrode 18 comprises a material that is resistant to electromigration and outdiffusion of material under external electrical bias voltage. For example, the first switch electrode 18 may comprise, and/or may consist essentially of, at least one metallic barrier material, at least one refractory metal, a high conductivity metal, a conductive metal oxide, a heavily doped semiconductor material, alloys or compounds thereof, and/or a layer stack thereof.

In some embodiments, each of the first switch electrode 18 may, or may not, comprise a respective upper portion composed of copper or aluminum. In one embodiment, the first subset of the fifth conductive line structures 658 that does not contact the non-Ohmic switching material portion 12 may comprise copper or aluminum, and the first switch electrode 18 may comprise a respective upper portion composed of copper or aluminum. In one embodiment, the first switch electrode 18 may comprise a lower portion including a conductive material that is different from copper or aluminum. In this embodiment, the first subset of the fifth conductive line structures 658 that does not contact the non-Ohmic switching material portion 12 may, or may not, comprise the conductive material of the lower portions of the first switch electrode 18. In one embodiment, the first switch electrode 18 may comprise, and/or may consist essentially of, a conductive material that is different from copper or aluminum, and the first subset of the fifth conductive line structures 658 may comprise a different material than the conductive material of the first switch electrode 18. In one embodiment, the first subset of the fifth conductive line structures 658 may comprise copper and/or aluminum, and the first switch electrode 18 may be free of copper and/or aluminum.

The height of the first switch electrode 18 may be in a range from 30 nm to 500 nm, such as from 50 nm to 300 nm, although lesser and greater thicknesses may also be used. In one embodiment, top surfaces of the first switch electrode 18 may be located within the horizontal plane including the top surface of the fifth interconnect-level dielectric material layer 650.

Figure 1F:
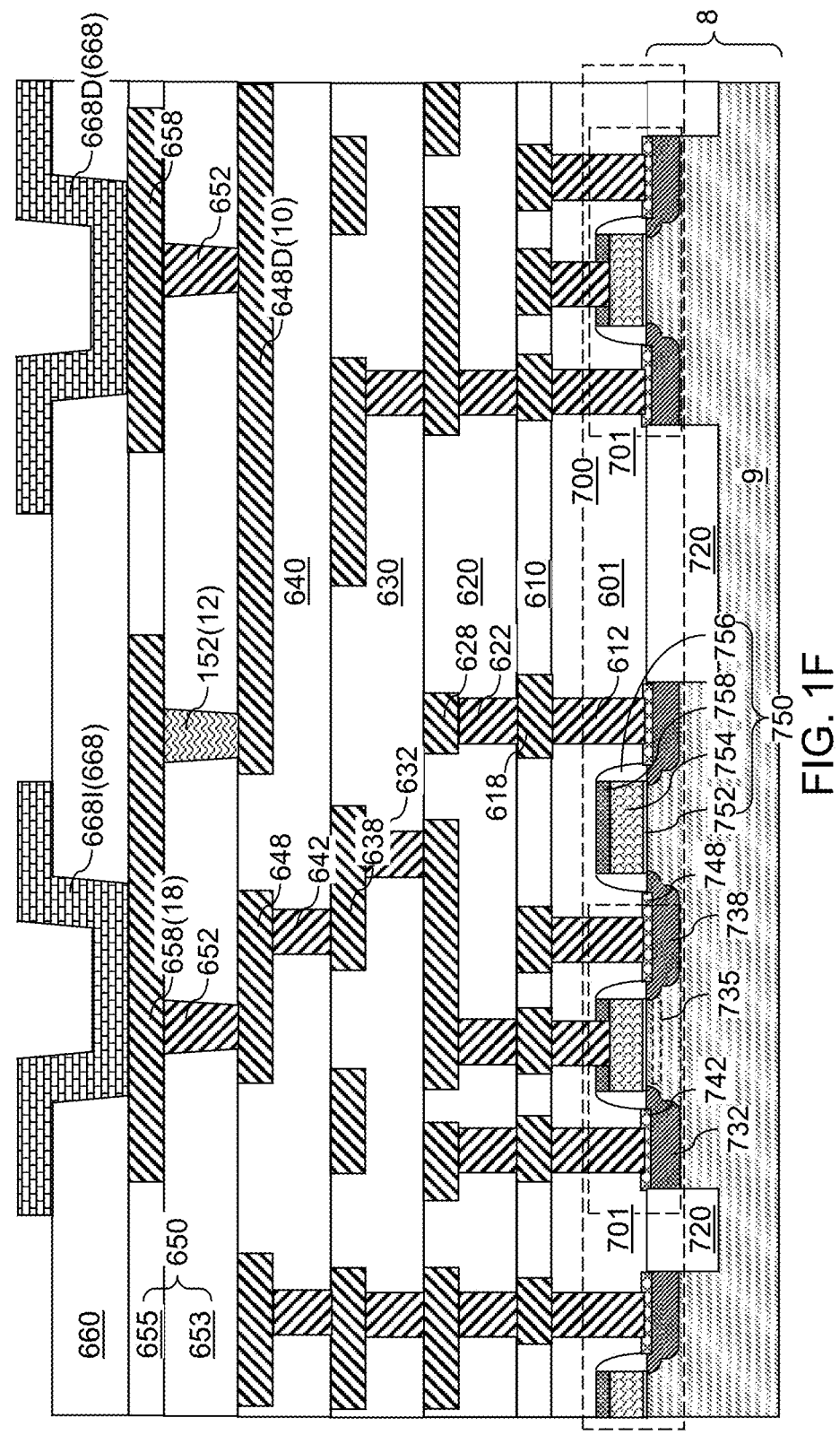

Referring to FIG. 1F, a bonding-level dielectric layer 660 may be formed over the fifth interconnect-level dielectric layer 650. Optionally, at least one additional interconnect-level dielectric material layer (not shown) and additional metal interconnect structures (not shown) may be formed over the fifth interconnect-level dielectric layer 650 prior to formation of the bonding-level dielectric layer 660. Pad cavities may be formed in the bonding-level dielectric layer 660, and metal pads 668 may be formed in the pad cavities. The metal pads 668 may comprise a signal input pad 6681 and an electrostatic discharge pad 668D. The signal input pad 6681 may be electrically connected to, and/or may contact, the first switch electrode 18. The electrostatic discharge pad 668D may be electrically connected to the electrostatic discharge line 648D via a set of metal interconnect structures, and forms a component of an electrostatic discharge path. The electrostatic discharge pad 668D may be replaced with an alternative electrostatic discharge structure such as an electrostatic discharge line, an electrostatic discharge plate, an electrostatic discharge metallic frame, etc.

Generally, an electrostatic discharge (ESD) switch may be formed over dielectric material layers (601, 610, 620, 630, 640). The first embodiment structure comprises a device structure that includes semiconductor device 701 located on a substrate 8; metal interconnect structures (612, 618, 622, 628, 632, 638, 642, 648) located in dielectric material layers (601, 610, 620, 630, 640, 650, 660) overlying the semiconductor devices 701; and a non-Ohmic voltage-triggered switch (18, 12, 10) comprising a first switch electrode 18 that is electrically connected to one of the semiconductor devices 701 through a subset of the metal interconnect structures (612, 618, 622, 628, 632, 638, 642, 648), a second switch electrode 10, and a non-Ohmic switching material portion 12 providing a non-Ohmic current-voltage characteristics and in contact with the first switch electrode 18 and the second switch electrode 10.

In one embodiment, the non-Ohmic switching material portion 12 comprises an ovonic threshold material or a phase change memory material. In one embodiment, the non-Ohmic switching material portion 12 comprises a sidewall surface segment that contacts a first dielectric material layer (such as the via-level dielectric material layer 653) selected from the dielectric material layers (601, 610, 620, 630, 640, 650, 660).

In one embodiment, the non-Ohmic switching material portion 12 comprises a via structure 152; and an entirety of the top surface of the non-Ohmic switching material portion 12 is in contact with a segment of a bottom surface of the first switch electrode 18. In one embodiment, the second switch electrode 10 is formed a first conductive line; the non-Ohmic switching material portion 12 is formed as a via structure 152 directly on a top surface of the second switch electrode 10; and the first switch electrode 18 is formed as a second conductive line on a top surface of the non-Ohmic switching material portion 12. In one embodiment, the first switch electrode 18 contacts a top surface of the non-Ohmic switching material portion 12; and the second switch electrode 10 contacts a bottom surface of the non-Ohmic switching material portion 12. The threshold voltage of the non-Ohmic switching material portion 12 may be controlled by the height of the via structure 152.

According to an aspect of the present disclosure, a device structure of the present disclosure may comprise: semiconductor devices 701 located on a substrate 8; first metal interconnect structures (612, 618, 622, 628, 632, 638, 642, 648) located in first dielectric material layers (601, 610, 620, 630, 640) overlying the semiconductor devices 701; an electrostatic discharge line 648D overlying the first dielectric material layers (601, 610, 620, 630, 640); and an electrostatic discharge (ESD) switch overlying the first dielectric material layers (601, 610, 620, 630, 640) comprising a first switch electrode 18 that is electrically connected to one of the semiconductor devices 701 through a subset of the metal interconnect structures (612, 618, 622, 628, 632, 638, 642, 648), a second switch electrode 10 that is electrically connected to the electrostatic discharge line 648D, and a non-Ohmic switching material portion 12 providing a non-Ohmic current-voltage characteristics and in contact with the first switch electrode 18 and the second switch electrode 10, wherein the non-Ohmic switching material portion 12 comprises an ovonic threshold material or a phase change memory material.

In one embodiment, the second switch electrode 10 comprises a first conductive line; the first switch electrode 18 comprises a second conductive line; and the non-Ohmic switching material portion 12 comprises a via structure 152 that is laterally surrounded by a second dielectric material layer (such as a via-level dielectric material layer 653) that overlies the first dielectric material layers (601, 610, 620, 630, 640) and contacts a bottom surface of the first switch electrode 18 and contacts a top surface of the second switch electrode 10. The electrostatic discharge line 648D is electrically connected to the second switch electrode 10.

FIGS. 2A-2D are sequential vertical cross-sectional views of a second embodiment structure during formation of a device structure of the present disclosure.

Figure 2A:
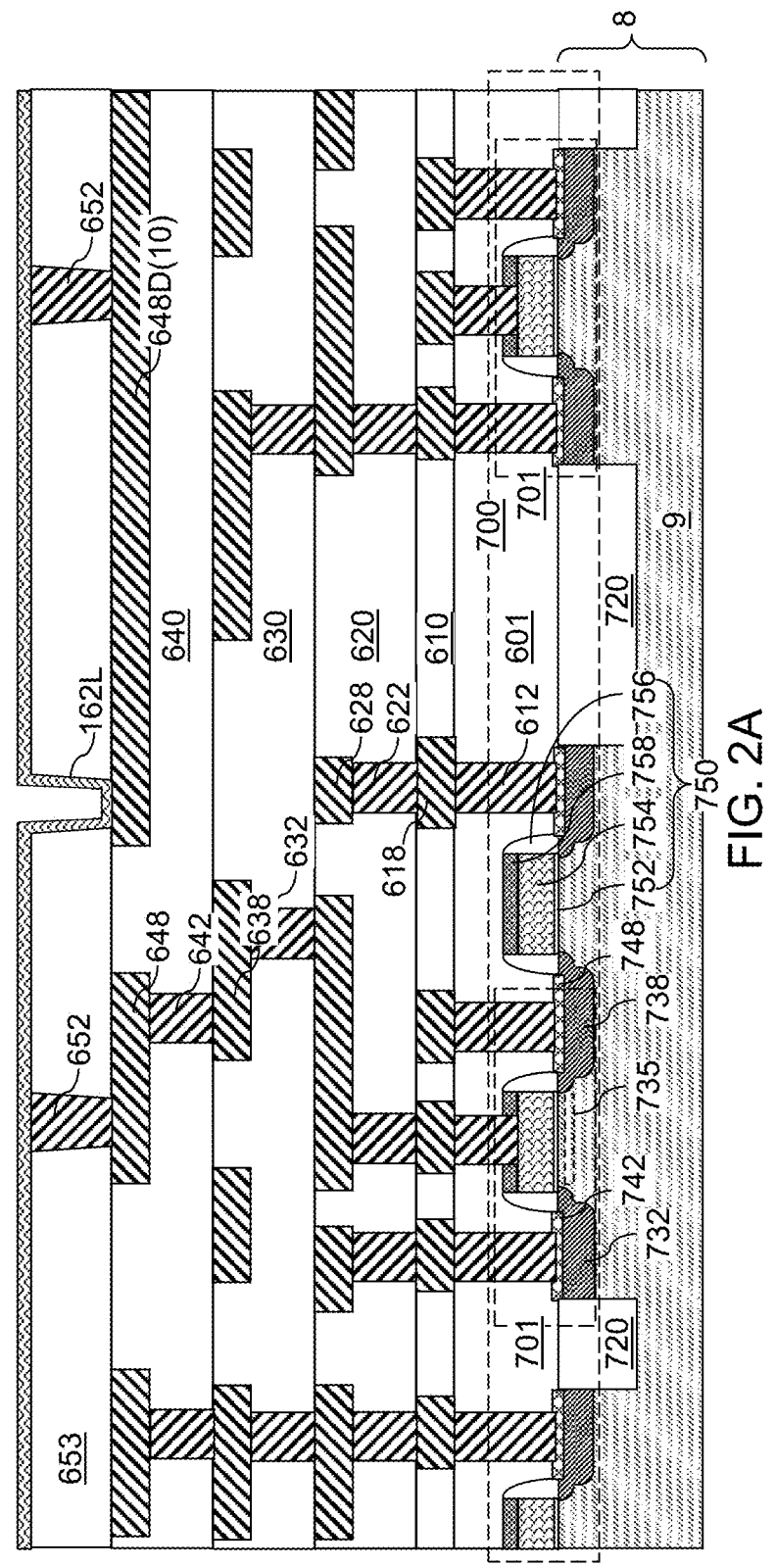
FIGS. 2A-2D are sequential vertical cross-sectional views of a second structure during formation of a device structure according to an embodiment of the present disclosure.

Referring to FIG. 2A, the second embodiment structure may be derived from the first embodiment structure illustrated in FIG. 1C by depositing at least one non-Ohmic switching material such that the at least one non-Ohmic switching material does not completely fill the volume of the via opening 159 (illustrated in FIG. 1C). The at least one non-Ohmic switching material forms a non-Ohmic switching material layer 162L. A void that is not filled with the non-Ohmic switching material layer 162L is present at a center portion of the via opening 159. The non-Ohmic switching material layer 162L may comprise any material that may be used for the non-Ohmic switching material portion 12 described above with reference to FIG. 1D. The non-Ohmic switching material layer 162L may be conformally or non-conformally deposited over the via-level dielectric material layer 653.

Figure 2B:
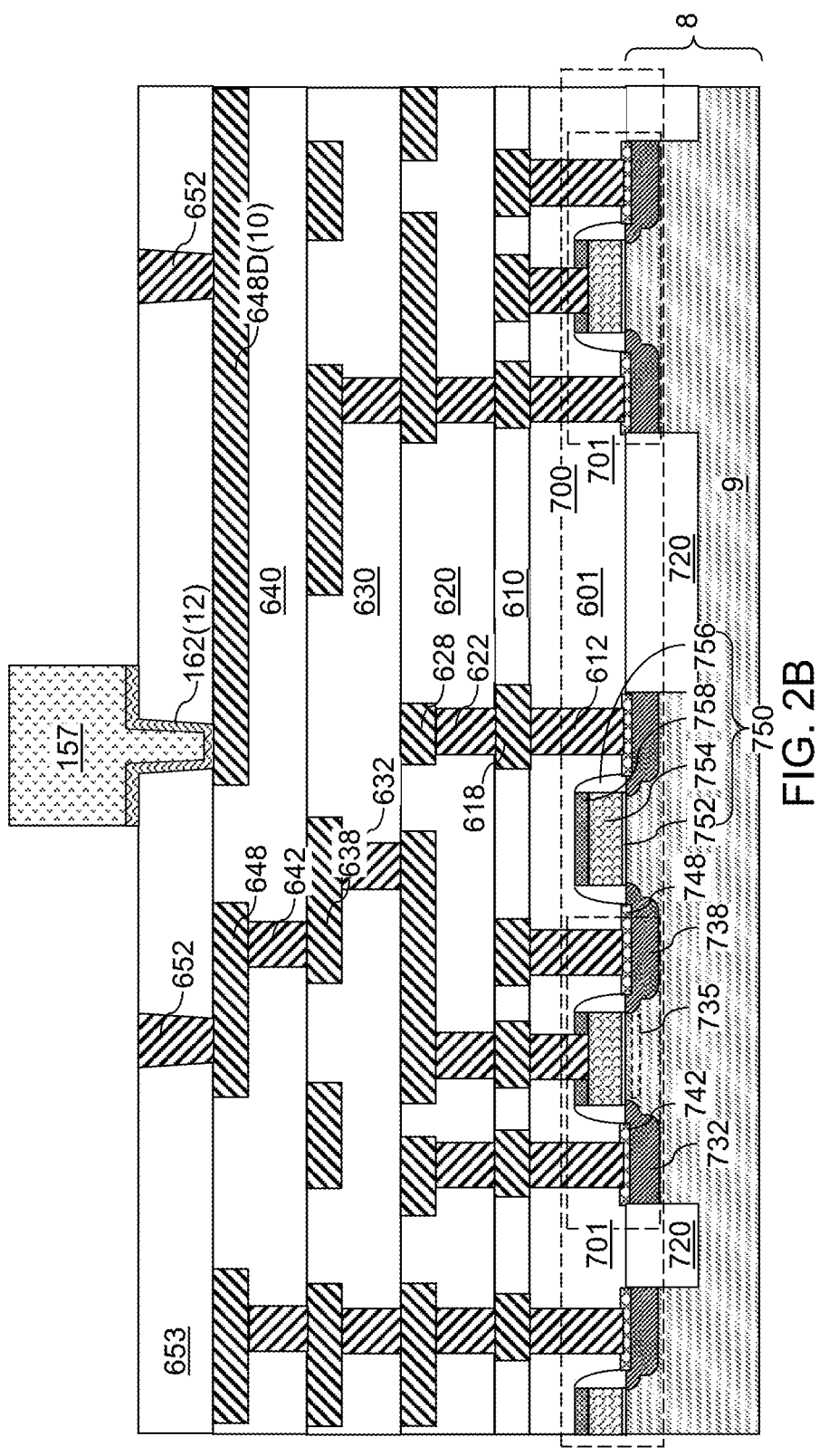

Referring to FIG. 2B, a photoresist layer 157 may be applied over the non-Ohmic switching material layer 162L, and may be lithographically patterned to form a discrete photoresist material portion that covers the entire area of the via opening. The periphery of the discrete photoresist material portion may be laterally offset outward from the upper periphery of the via opening by a lateral offset distance, which may be in a range from 3 nm to 100 nm, such as from 6 nm to 50 nm. An etch process may be performed to remove unmasked portions of the non-Ohmic switching material layer 162L. A patterned remaining portion of the non-Ohmic switching material layer 162L constitutes a non-Ohmic switching material portion 12, which may comprise a via liner 162 contacting a sidewall of a via opening through the via-level dielectric material layer 653. In one embodiment, the via liner 162 may comprise a horizontally-extending portion (which may be an annular plate portion) that contacts a surface segment of the top surface of the via-level dielectric material layer 653. The thickness of a horizontally-extending portion of the via liner 162 contacting a top surface of the second switch electrode 10 may be in a range from 10 nm to 100 nm, such as from 20 nm to 60 nm, although lesser and greater thicknesses may also be used. The photoresist layer 157 may be removed selective to the via liner 162, for example, by ashing.

Figure 2C:
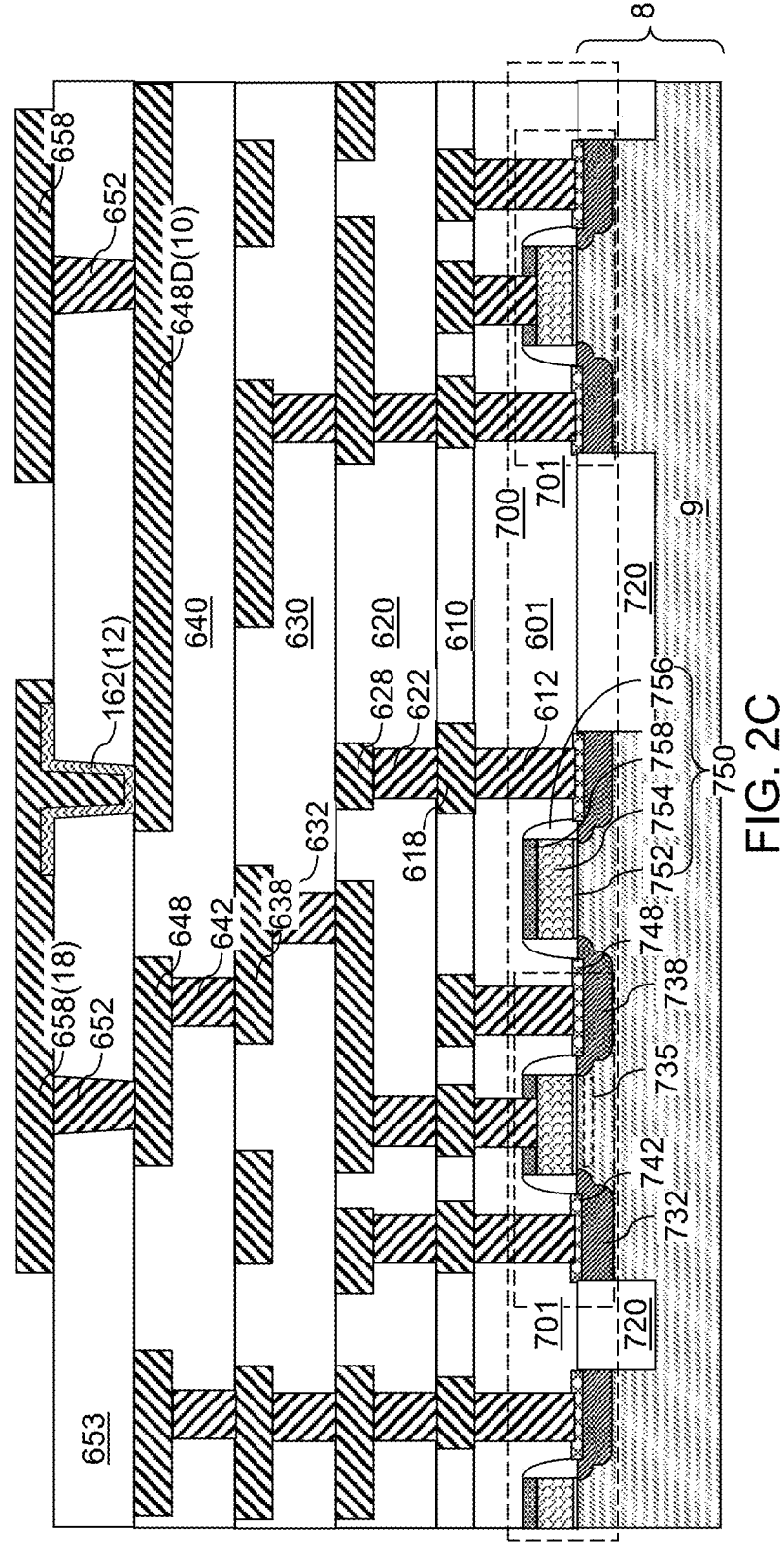

Referring to FIG. 2C, fifth conductive line structures 658 may be formed over the via-level dielectric material layer 653, the non-Ohmic switching material portion (comprising the via liner 162), and the fourth conductive via structures 652. The fifth conductive line structures 658 are conductive line structures, such as metallic line structures.

The fifth conductive line structures 658 may comprise a first subset of the fifth conductive line structures 658 that does not contact the non-Ohmic switching material portion 12 (comprising the via liner 162) and is used as metal interconnect lines for semiconductor devices 701, and a second subset of the fifth conductive line structures 658 that is used as a first switch electrode 18 and directly contact a top surface of the non-Ohmic switching material portion 12 and a top surface of at least one fourth conductive via structure 652. In one embodiment, one, a plurality, and/or each of the fifth conductive line structures 658 within the first subset of the fifth conductive line structures 658 may contact top surface of a respective fourth conductive via structure 652.

The first subset of the fifth conductive line structures 658 and the second subset of the fifth conductive line structures 658 may, or may not, comprise a same set of conductive materials. For example, the first subset of the fifth conductive line structures 658 may comprise copper-based metal portions and/or aluminum-based metal portions. The second subset of the fifth conductive line structures 658, comprising the first switch electrode 18, may comprise any material that may be used for the second switch electrode 10 as discussed above.

In one embodiment, the first switch electrode 18 is electrically connected to at least one semiconductor device 701 located on the substrate 8. In one embodiment, a node of a semiconductor device 701 that is electrically connected to the first switch electrode 18 may comprise an input node of a semiconductor device 701 such as a gate electrode of a field effect transistor. In this embodiment, the electrically conductive path between the first switch electrode 18 and the input node of the semiconductor device 701 comprises an input signal path composed of metal interconnect structures.

Optionally, at least one of the fourth conductive via structures 652 and/or at least one of the fifth conductive line structures 658 may be electrically connected to the second switch electrode 10, which also functions as an electrostatic discharge line 648D, and may be used as components of an electrostatic discharge path.

According to an aspect of the present disclosure, the first switch electrode 18 comprises a material that is resistant to electromigration and outdiffusion of material under external electrical bias voltage. Generally, the materials that may be used for the first switch electrode 18 and for the first subset of the fifth conductive line structures 658 that does not contact the non-Ohmic switching material portion 12 may be the same as described with reference to the first embodiment structure.

The height of the first switch electrode 18 may be in a range from 30 nm to 500 nm, such as from 50 nm to 300 nm, although lesser and greater thicknesses may also be used. In one embodiment, top surfaces of the first switch electrode 18 may be located within the horizontal plane including the top surface of the fifth interconnect-level dielectric material layer 650.

Figure 2D:
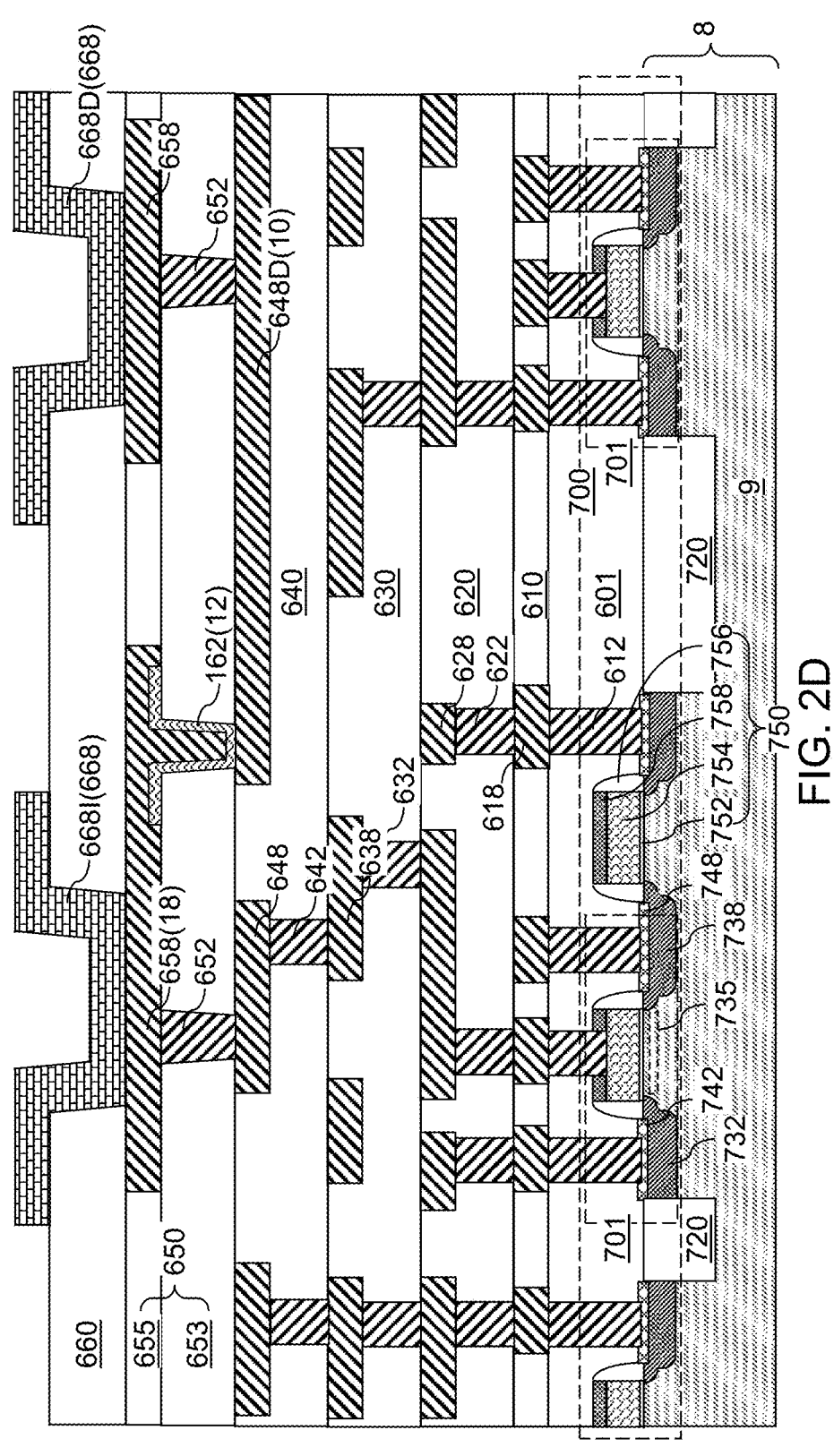

Referring to FIG. 2D, a line-level dielectric material layer 655 may be formed over fifth conductive line structures 658. The combination of the via-level dielectric material layer 653 and the line-level dielectric material layer 655 is herein referred to as an interconnect-level dielectric layer, or as a fifth interconnect-level dielectric material layer 650.

Subsequently, the processing steps described with reference to FIG. 1F may be performed to form a bonding-level dielectric layer 660 and metal pads 668. The metal pads 668 may comprise a signal input pad 6681 and an electrostatic discharge pad 668D.

Generally, the second embodiment structure may provide the same features as the first embodiment structure except that the non-Ohmic switching material portion 12 comprising a via liner 162 instead of a non-Ohmic switching material via structure 152. Further, the first switch electrode 18 may comprise a downward-protruding portion that protrudes into a volume of a via opening in which the via liner 162 is located. The downward-protruding portion of the first switch electrode 18 may contact an inner sidewall of the via liner 162. The threshold voltage of the non-Ohmic switching material portion 12 may be controlled by the thickness of a horizontally-extending portion of the via liner 162 located at a bottom portion of a via opening.

In one embodiment, the non-Ohmic switching material portion 12 (comprising a via liner 162) comprises a sidewall surface segment that contacts a first dielectric material layer (such as a via-level dielectric material layer 653) selected from the dielectric material layers (601, 610, 620, 630, 640, 650, 660) of the second embodiment structure.

In one embodiment, the first switch electrode 18 contacts a top surface of the non-Ohmic switching material portion 12; and the second switch electrode 10 contacts a bottom surface of the non-Ohmic switching material portion 12. In one embodiment, the non-Ohmic switching material portion 12 comprises a via liner 162 located in a peripheral portion of a via opening; and the second switch electrode 10 comprises a portion located in an inner portion of the via opening and contacting an inner sidewall of the via liner 162.

In one embodiment, the second switch electrode 10 comprises a first conductive line; the non-Ohmic switching material portion 12 comprises a via liner 162 located in a peripheral portion of a via opening 159 in a second dielectric material layer that overlies first dielectric material layers (601, 610, 620, 630, 640); and the second switch electrode 18 comprises a second conductive line including a downward protruding portion located in an inner portion of the via opening 159 and contacting an inner sidewall of the via liner 162.

FIGS. 3A-3D are sequential vertical cross-sectional views of a third embodiment structure during formation of a device structure of the present disclosure.

Figure 3A:
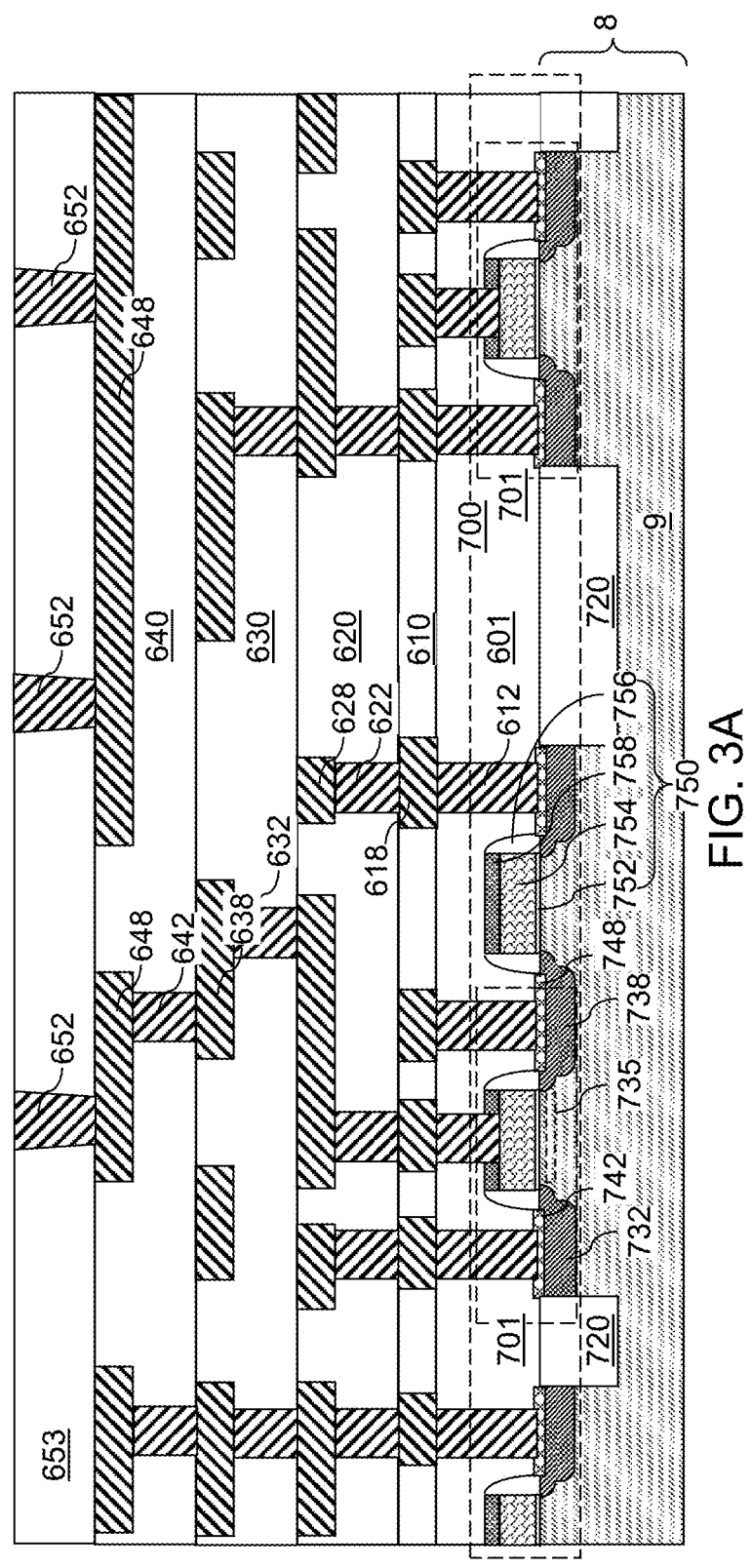
FIGS. 3A-3D are sequential vertical cross-sectional views of a third structure during formation of a device structure according to an embodiment of the present disclosure.

Referring to FIG. 3A, the third embodiment structure may be derived from the embodiment structure of FIG. 1B by forming an additional fourth conductive via structure 652 at a location in which a non-Ohmic switching material via structure 152 of the first embodiment structure is subsequently formed. In other words, an additional fourth conductive via structure 652 is formed instead of the non-Ohmic switching material via structure 152 of the first embodiment structure.

Figure 3B:
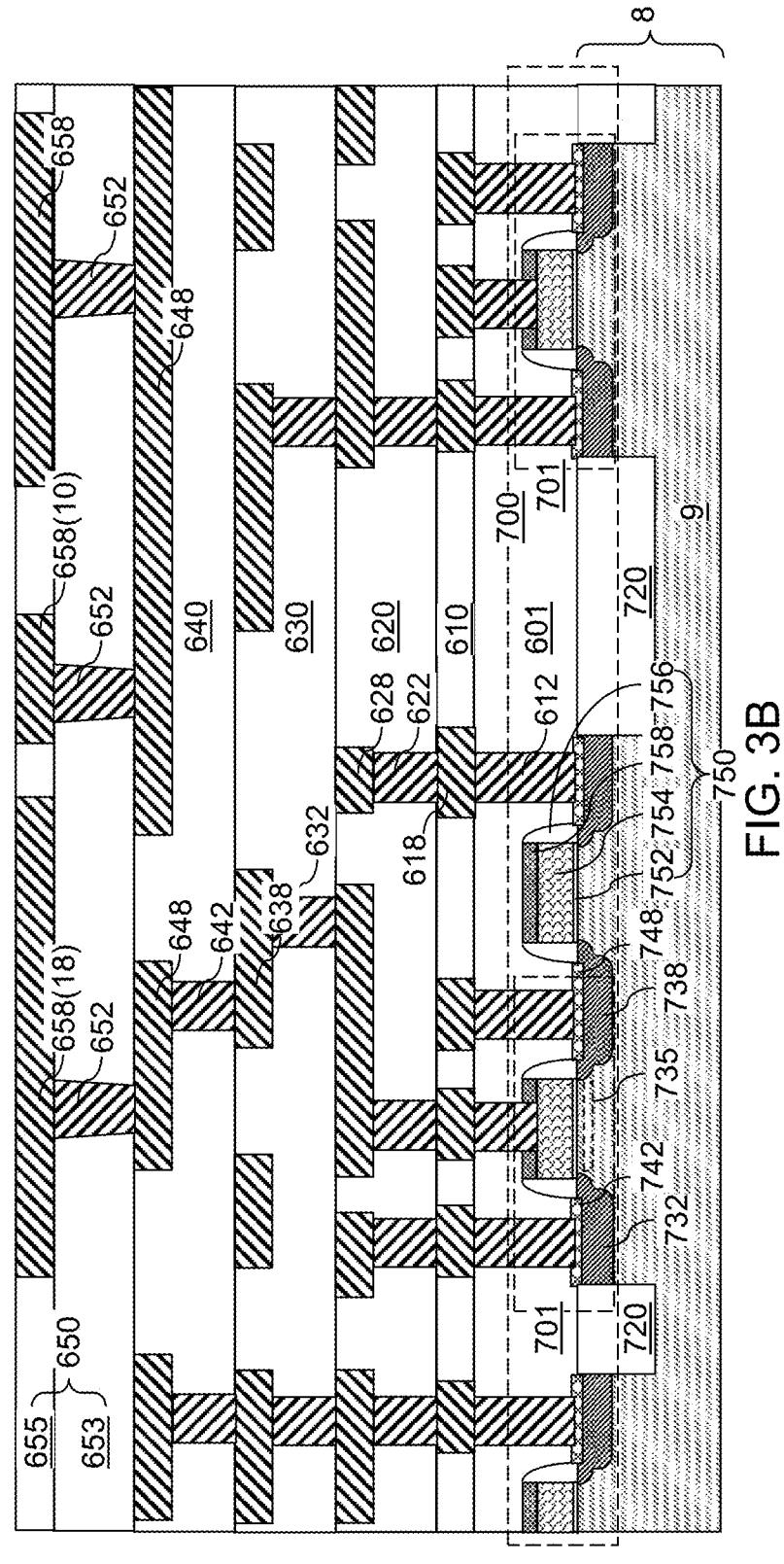

Referring to FIG. 3B, a line-level dielectric material layer 655 and fifth conductive line structures 658 may be formed over the via-level dielectric material layer 653. The combination of the via-level dielectric material layer 653 and the line-level dielectric material layer 655 is herein referred to as an interconnect-level dielectric layer, or as a fifth interconnect-level dielectric material layer 650. The fifth conductive line structures 658 are conductive line structures, such as metallic line structures, that are formed in the fifth interconnect-level dielectric material layer 650.

The fifth conductive line structures 658 may comprise a first subset of the fifth conductive line structures 658 that is not electrically connected to a non-Ohmic switching material portion to be subsequently formed, and a second subset of the fifth conductive line structures 658 that is used as a combination of a first switch electrode 18 and a second switch electrode 10. In one embodiment, one, a plurality, and/or each of the fifth conductive line structures 658 within the first subset of the fifth conductive line structures 658 may contact top surface of a respective fourth conductive via structure 652.

The first subset of the fifth conductive line structures 658 and the second subset of the fifth conductive line structures 658 may, or may not, comprise a same set of conductive materials. For example, the first subset of the fifth conductive line structures 658 may comprise copper-based metal portions and/or aluminum-based metal portions. The second subset of the fifth conductive line structures 658, comprising a combination of the first switch electrode 18 and the second switch electrode, may comprise any material that may be used for the second switch electrode 10 in the first embodiment structure.

According to an aspect of the present disclosure, the first switch electrode 18 and the second switch electrode 10 comprise a material that is resistant to electromigration and outdiffusion of material under external electrical bias voltage. The first switch electrode 18 and the second switch electrode 10 may comprise a same set of at least one conductive material, which may be any material that may be used for the second switch electrode 10 in the first embodiment structure. The height of the first switch electrode 18 and the second switch electrode 10 may be in a range from 30 nm to 500 nm, such as from 50 nm to 300 nm, although lesser and greater thicknesses may also be used. In one embodiment, top surfaces of the first switch electrode 18 and the second switch electrode 10 may be located within the horizontal plane including the top surface of the fifth interconnect-level dielectric material layer 650.

In one embodiment, the first switch electrode 18 is electrically connected to at least one semiconductor device 701 located on the substrate 8. In one embodiment, a node of a semiconductor device 701 that is electrically connected to the first switch electrode 18 may comprise an input node of a semiconductor device 701 such as a gate electrode of a field effect transistor. In this embodiment, the electrically conductive path between the first switch electrode 18 and the input node of the semiconductor device 701 comprises an input signal path composed of metal interconnect structures.

Figure 3C:
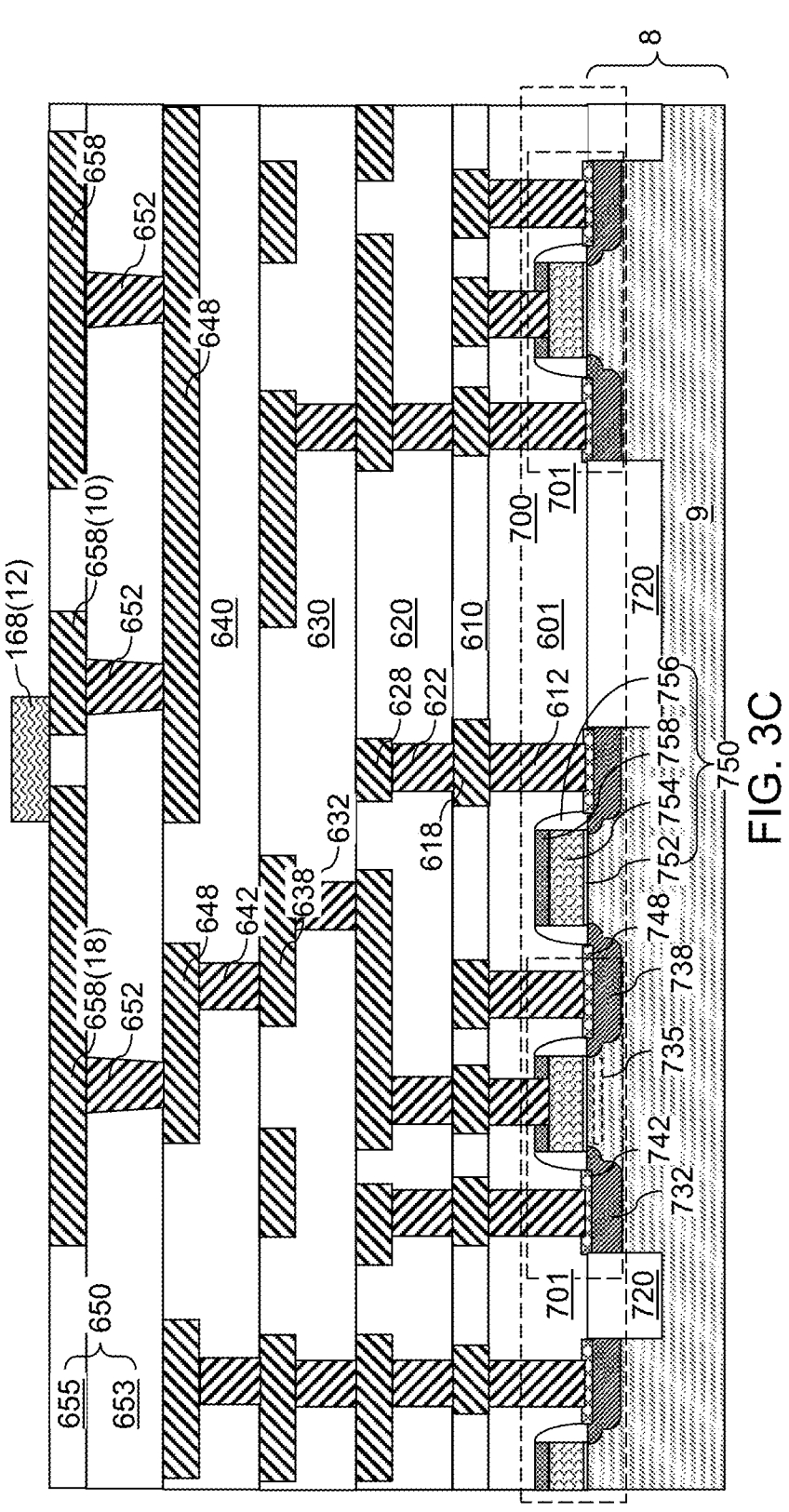

Referring to FIG. 3C, a non-Ohmic switching material layer may be deposited over the top surface of the fifth interconnect-level dielectric material layer 650, the first switch electrode 18, and the second switch electrode 10. The material(s) of the non-Ohmic switching material layer may comprise any material that may be used for the non-Ohmic switching material portions 12 described with reference to FIG. 1D. The thickness of the non-Ohmic switching material layer may be in range from 30 nm to 500 nm, such as from 60 nm to 300 nm, although lesser and greater thicknesses may also be used.

The non-Ohmic switching material layer may be lithographically patterned to form a non-Ohmic switching material portion 12, comprising a non-Ohmic switching material plate 168 having a uniform thickness throughout. For example, a photoresist layer (not shown) may be applied over the non-Ohmic switching material layer, and may be lithographically patterned to form a discrete photoresist material portion that extend between, and cover end portions of, the first switch electrode 18 and the second switch electrode 10. An etch process may be performed to remove portions of the non-Ohmic switching material layer that are not covered by the discrete photoresist material portion. The photoresist material portions may be subsequently removed, for example, by ashing. The remaining portion of the non-Ohmic switching material layer constitutes the non-Ohmic switching material portion 12 (comprising the non-Ohmic switching material plate 168).

In the third embodiment structure, the non-Ohmic switching material portion 12 may be formed as a plate structure having a uniform thickness throughout, contacting a top surface segment of the first switch electrode 18, and contacting a top surface segment of the second switch electrode 10.

Figure 3D:
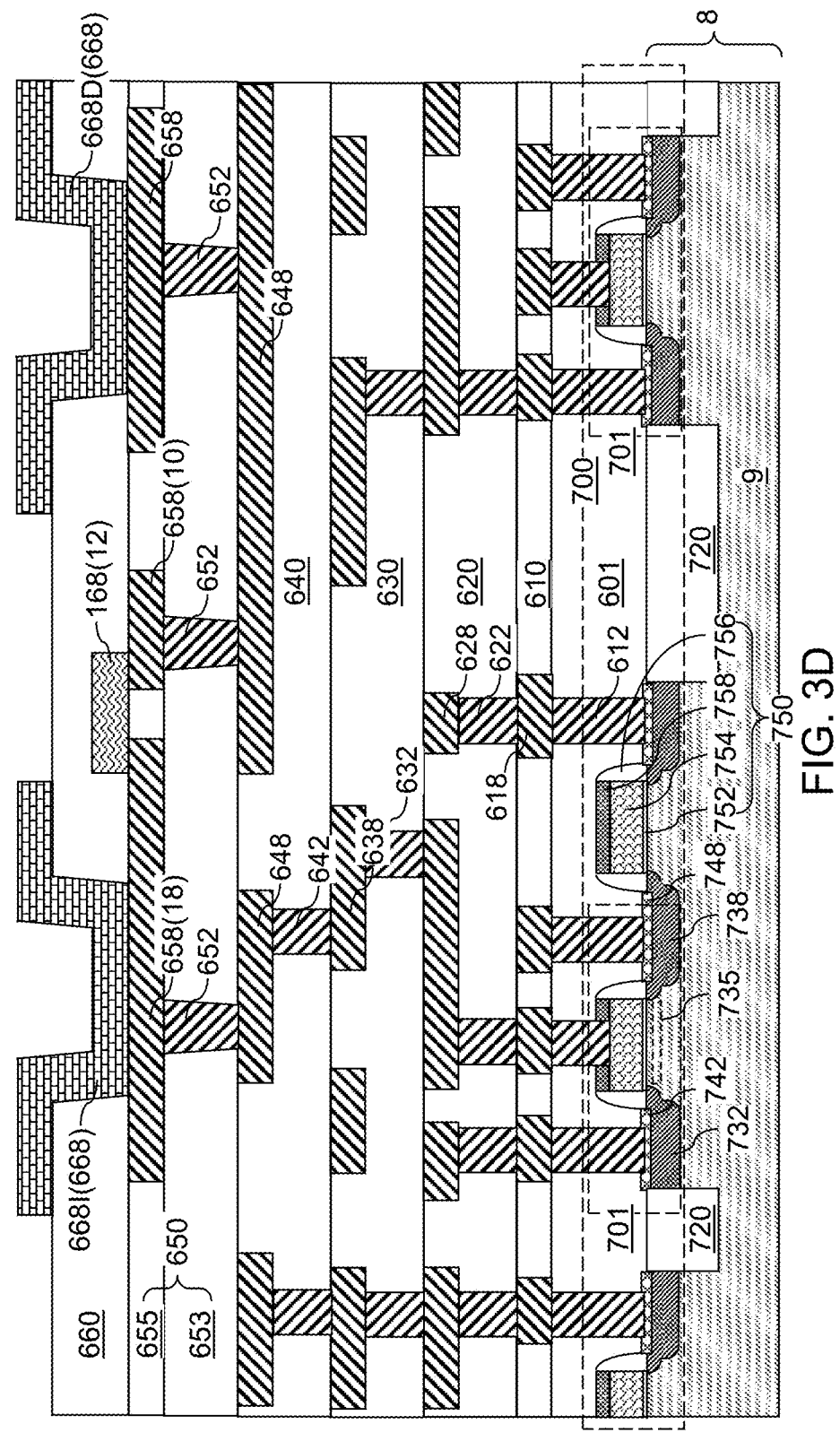

Referring to FIG. 3D, the processing steps described with reference to FIG. 1F may be performed to form a bonding-level dielectric layer 660 and metal pads 668. The metal pads 668 may comprise a signal input pad 6681 and an electrostatic discharge pad 668D.

Generally, the third embodiment structure may provide the same features as the first embodiment structure except that the non-Ohmic switching material portion 12 comprises a non-Ohmic switching material plate 168 instead of a non-Ohmic switching material via structure 152. Further, the first switch electrode 18 and the second switch electrode 10 are formed at a same level, and may have a same thickness and a same material composition. The threshold voltage of the non-Ohmic switching material portion 12 may be controlled by a lateral spacing between the first switch electrode 18 and the second switch electrode 10.

In one embodiment, the non-Ohmic switching material portion 12 (comprising a non-Ohmic switching material plate 168) comprises a sidewall surface segment that contacts a first dielectric material layer (such as a bonding-level dielectric layer 660) selected from the dielectric material layers (601, 610, 620, 630, 640, 650, 660) of the third embodiment structure.

In one embodiment, the first switch electrode 18 contacts a first bottom surface segment of the non-Ohmic switching material portion 12; and the second switch electrode 10 contacts a second bottom surface segment of the non-Ohmic switching material portion 12. In one embodiment, the non-Ohmic switching material portion 12 comprises a non-Ohmic switching material plate 168 located above a horizontal plane including the top surfaces of the first switch electrode 18 and the second switch electrode 10. In one embodiment, the first switch electrode 18 and the second switch electrode 10 have top surface segments located within a horizontal plane; and the non-Ohmic switching material portion 12 (comprising the non-Ohmic switching material plate 168) comprises a bottom surface contacting the top surface segments of the first switch electrode 18 and the second switch electrode 10. In one embodiment, an entirety of the non-Ohmic switching material portion 12 (comprising the non-Ohmic switching material plate 168) has a uniform vertical thickness throughout.

FIGS. 4A-4D are sequential vertical cross-sectional views of a fourth embodiment structure during formation of a device structure of the present disclosure.

Figure 4A:
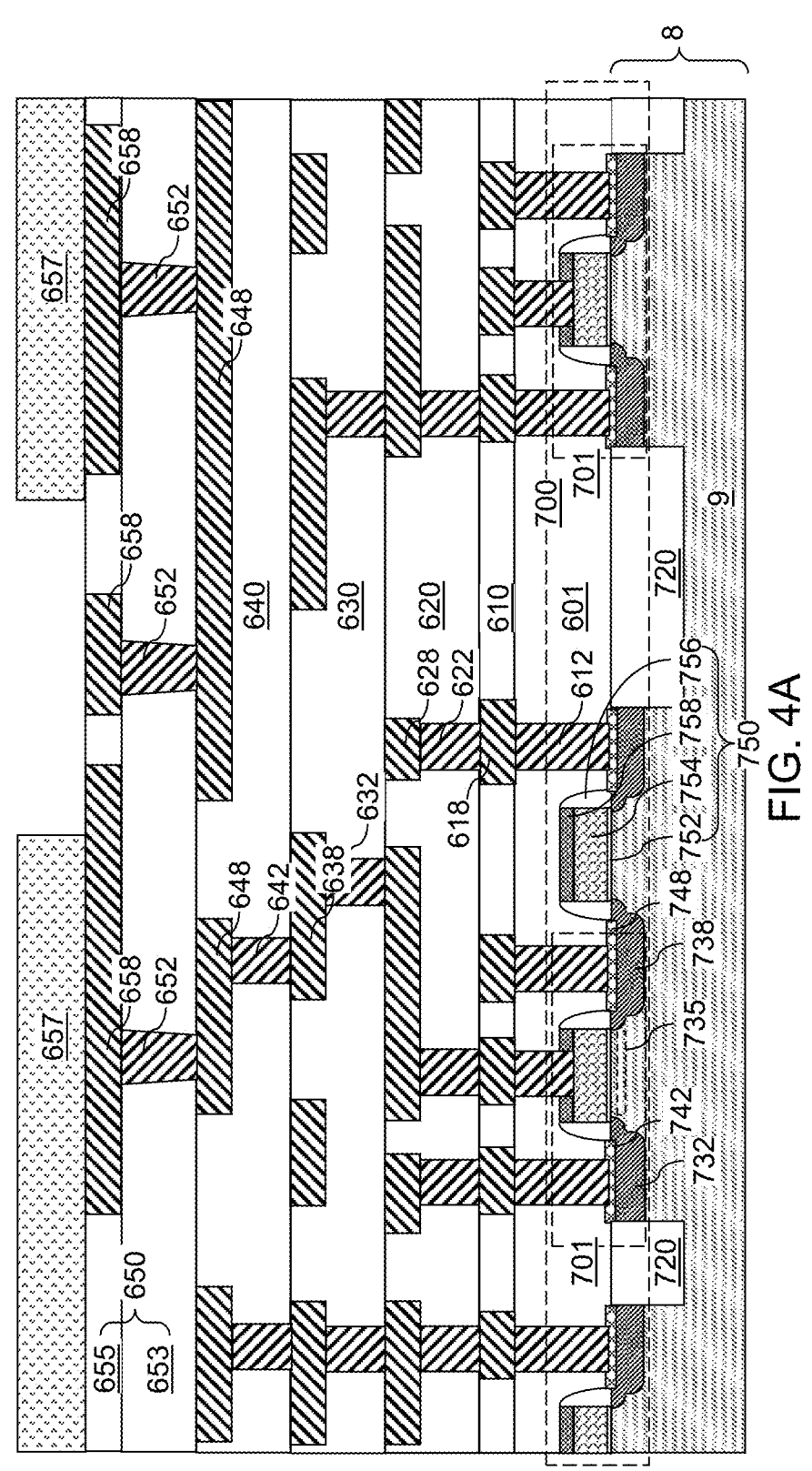
FIGS. 4A-4D are sequential vertical cross-sectional views of a fourth structure during formation of a device structure according to an embodiment of the present disclosure.

Referring to FIG. 4A, the fourth embodiment structure may be derived from the third embodiment structure illustrated in FIG. 3B. In the fourth embodiment structure, all of the fifth conductive line structures 658 may be formed with the same material composition, which may be any of the material compositions that may be used for the first conductive line structures 618, the second conductive line structures 628, the third conductive line structures 638, and/or the fourth conductive line structures 648. In an illustrative example, the fifth conductive line structures 658 may comprise a combination of a metallic barrier material (such as TiN, TaN, WN, MoN, TiC, TaC, WC, etc.) and a metallic fill material (such as Cu, Al, Mo, W, Co, Ru, Ti, Ta, etc.).

A masking material layer 657 may be applied over the fifth interconnect-level dielectric material layer 650. The masking material layer 657 may be a photoresist layer, or may be a hard mask layer such as a silicon nitride layer. The masking material layer 657 may be patterned to cover all fifth conductive line structures 658 except a conductive line structure 658 that is electrically connected to a semiconductor device 701 which needs to be protected against electrostatic discharge events and except another conductive line structure 658 that forms an element within an electrostatic discharge path. Generally, the conductive line structure 658 that is electrically connected to a semiconductor device 701 which needs to be protected against electrostatic discharge events, and the conductive line structure 658 that forms an element within the electrostatic discharge path, are laterally spaced apart by a lateral spacing, which may be in a range from 30 nm to 1,000 nm, such as from 60 nm to 500 nm. Top surfaces of conductive line structure 658 (that is electrically connected to a semiconductor device 701 which needs to be protected against electrostatic discharge events) and the conductive line structure 658 (that forms an element within the electrostatic discharge path) are exposed adjacent to the lateral spacing between the two conductive line structures 658. The top surfaces of the two conductive line structures 658 may be fully, or partly, exposed to the opening in the masking material layer 657.

Figure 4B:
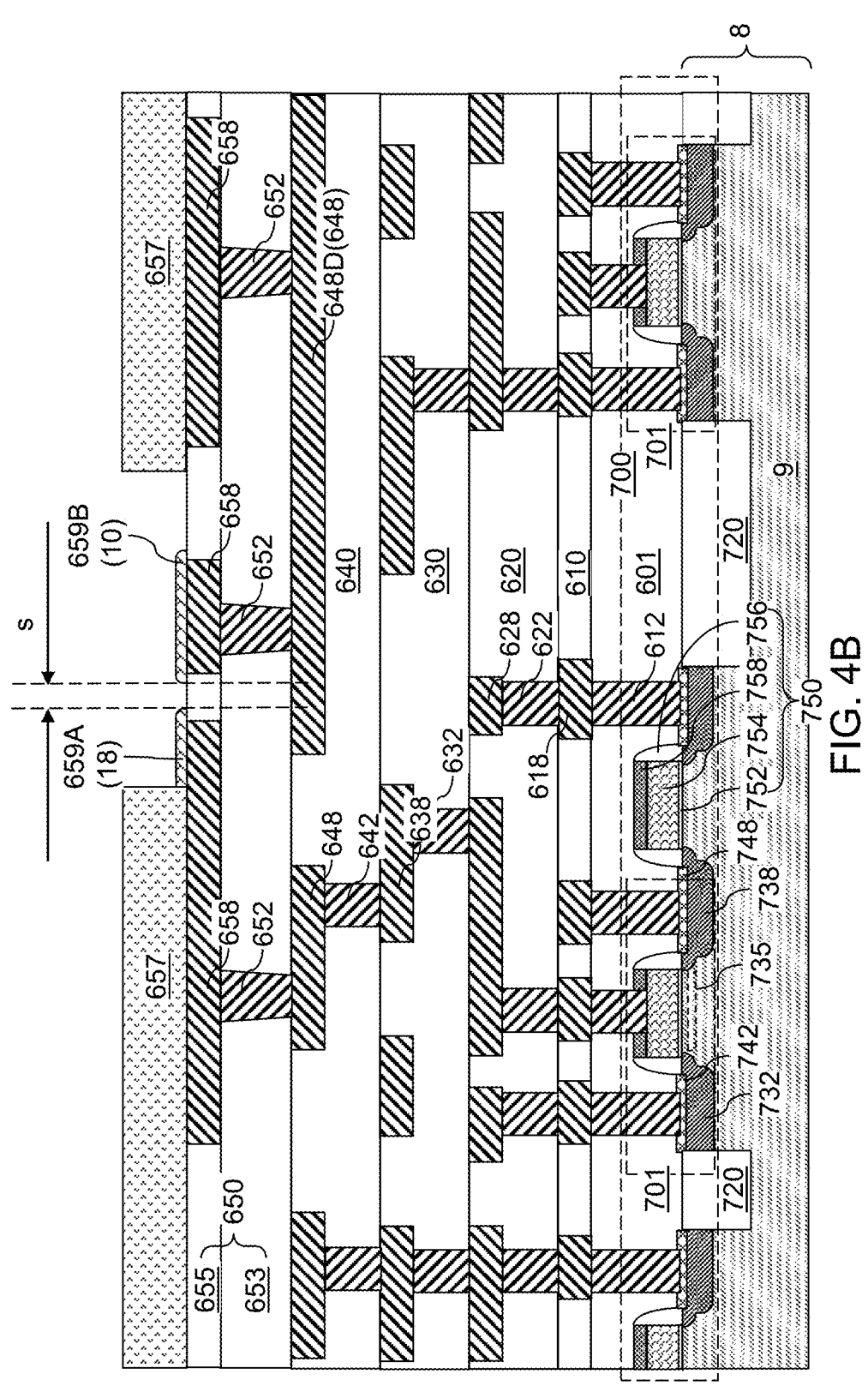

Referring to FIG. 4B, a selective metal deposition process may be performed to isotropically grow metal plates (659A, 659B) from the physically exposed surfaces of the two conductive line structures 658. The selective metal deposition process may comprise at least one electroplating process, or an area selective deposition process that deposits a metallic material only from physically exposed metallic surfaces while suppressing growth of the metallic material from physically exposed surfaces of the fifth interconnect-level dielectric material layer 650 and the masking material layer 657.

A first switch electrode 18 grows from a physically exposed top surface of the conductive line structure 658 that is electrically connected to a semiconductor device 701 which needs to be protected against electrostatic discharge events. A second switch electrode 10 grows from a physically exposed top surface of the conductive line structure 658 that forms an element within the electrostatic discharge path. The first switch electrode 18 comprises a first metal plate 659A, and the second switch electrode 10 comprises a second metal plate 659B. Generally, the first switch electrode 18 and the second switch electrode 10 may comprise any conductive material that may be selectively grown from the surfaces of the two conductive line structures 658. In one embodiment, the first switch electrode 18 and the second switch electrode 10 may comprise an electroplatable metallic material. In one embodiment, the first switch electrode 18 and the second switch electrode 10 may comprise a conductive material that may be formed by an area selective deposition (ASD) process known in the art. In one embodiment, the first switch electrode 18 and the second switch electrode 10 may be selected from the materials which may be used for the second switch electrode 10 of the first embodiment structure as described with reference to FIG. 1A and for which an electroplating process or an area selective deposition process is known.

According to an aspect of the present disclosure, the growth of the first switch electrode 18 and the second switch electrode 10 may continue until the lateral spacing between the first switch electrode 18 and the second switch electrode 10 reaches a target spacing s, which may be in a range from 20 nm to 300 nm, such as from 40 nm to 100 nm, although lesser and greater target spacings may also be used. The masking material layer 657 may be subsequently removed, for example, by ashing or by a wet etch process.

Figure 4C:
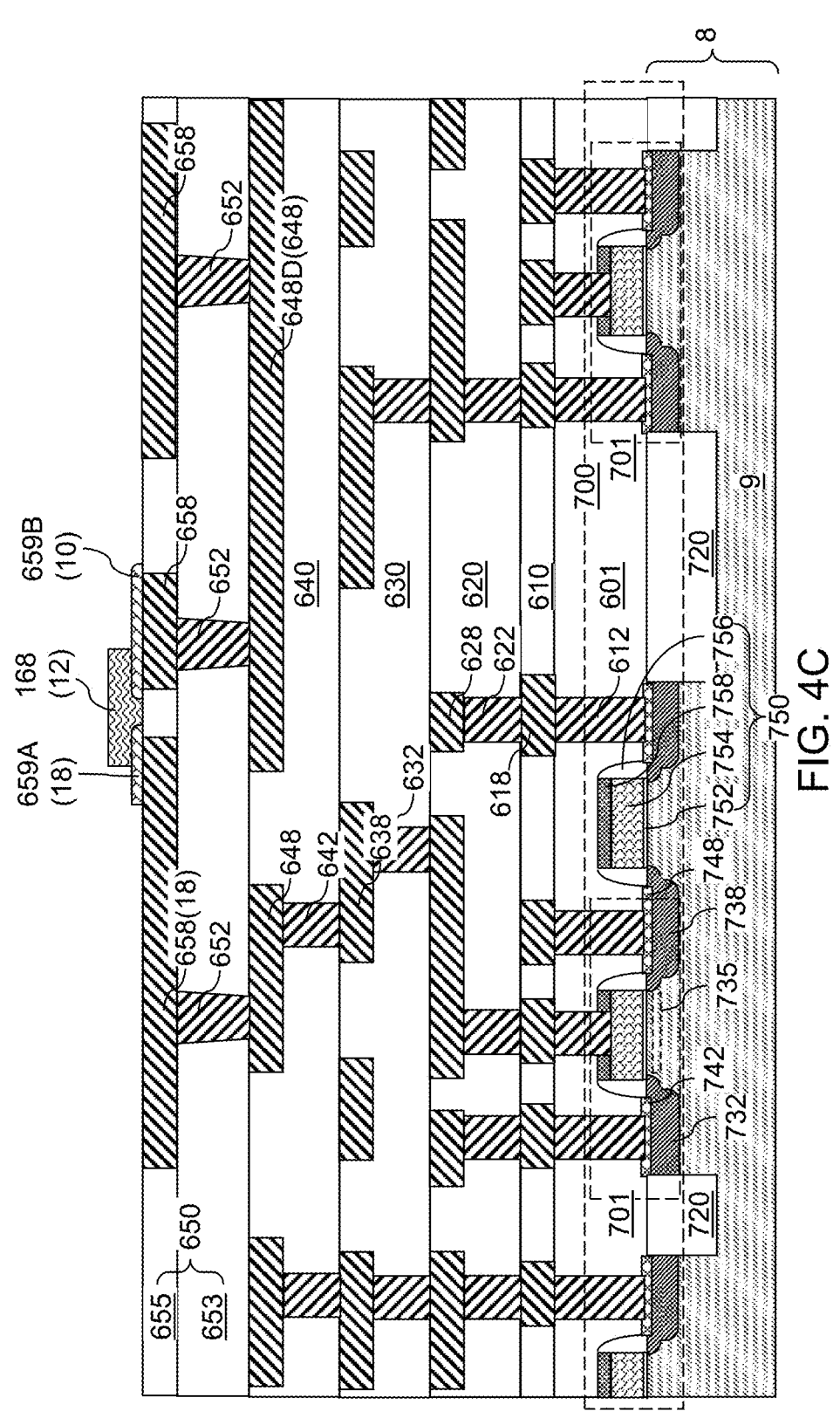

Referring to FIG. 4C, the processing steps described with reference to FIG. 3C may be performed to form a non-Ohmic switching material plate 168. Specifically, a non-Ohmic switching material layer may be deposited and patterned to form the non-Ohmic switching material plate 168, which constitutes the non-Ohmic switching material portion 12. Thus, the non-Ohmic switching material portion 12 may be formed as a plate structure having a downward-protruding portion located between the first switch electrode 18 and the second switch electrode 10. The non-Ohmic switching material portion 12 contacts a top surface segment of the first switch electrode 18, and contacts a top surface segment of the second switch electrode 10.

Generally, a pair of conductive lines (such as a pair of fifth conductive line structure 658) may be formed over dielectric material layers (601, 610, 620, 630, 640), and the first switch electrode 18 and the second switch electrode 10 may be formed as metal plates (659A, 659B) by deposition of a metallic material on the pair of conductive lines. The non-Ohmic switching material portion 12 may be formed as a plate structure (such as the non-Ohmic switching material plate 168) between the first switch electrode 18 and the second switch electrode 10.

Figure 4D:
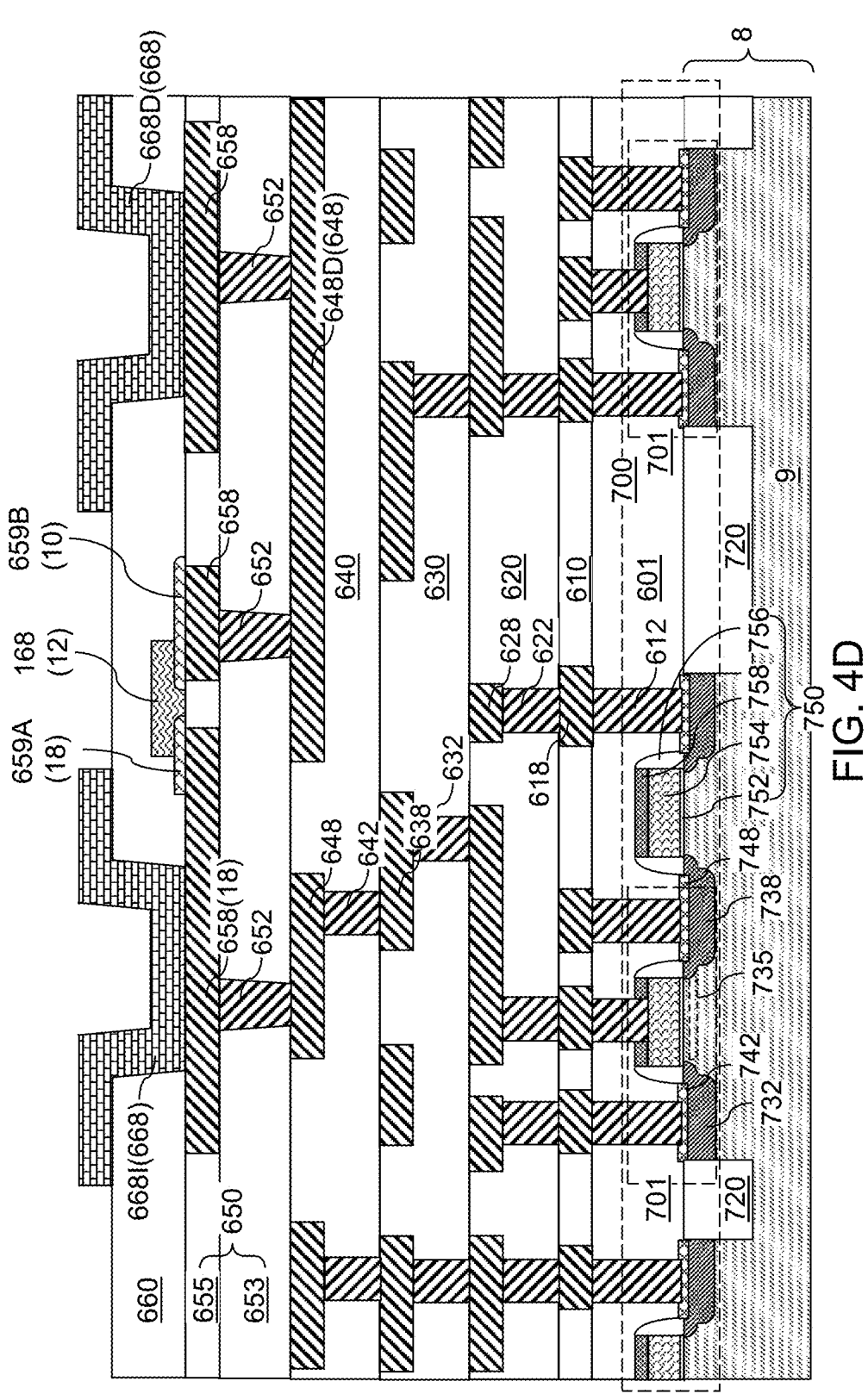

Referring to FIG. 4D, the processing steps described with reference to FIG. 1F may be performed to form a bonding-level dielectric layer 660 and metal pads 668. The metal pads 668 may comprise a signal input pad 6681 and an electrostatic discharge pad 668D.

Generally, the fourth embodiment structure may provide the same features as the third embodiment structure except that the first switch electrode 18 is formed as a first metal plate 659A and the second switch electrode 10 is formed as a second metal plate 659B. Further, the non-Ohmic switching material portion 12 may be formed as a plate structure having a downward-protruding portion located between the first switch electrode 18 and the second switch electrode 10. The non-Ohmic switching material portion 12 contacts a top surface segment of the first switch electrode 18, and contacts a top surface segment of the second switch electrode 10. The first switch electrode 18 and the second switch electrode 10 are formed at a same level, and may have a same thickness and a same material composition. The threshold voltage of the non-Ohmic switching material portion 12 may be controlled by the lateral spacing between the first switch electrode 18 and the second switch electrode 10.

In one embodiment, the non-Ohmic switching material portion 12 (comprising a non-Ohmic switching material plate 168) comprises a sidewall surface segment that contacts a first dielectric material layer (such as a bonding-level dielectric layer 660) selected from the dielectric material layers (601, 610, 620, 630, 640, 650, 660) of the fourth embodiment structure.

In one embodiment, the first switch electrode 18 contacts a first bottom surface segment of the non-Ohmic switching material portion 12; and the second switch electrode 10 contacts a second bottom surface segment of the non-Ohmic switching material portion 12. In one embodiment, the non-Ohmic switching material portion 12 comprises a non-Ohmic switching material plate 168 located above a horizontal plane including the bottom surfaces of the first switch electrode 18 and the second switch electrode 10. In one embodiment, the first switch electrode 18 and the second switch electrode 10 have bottom surface segments located within a horizontal plane (such as the horizontal plane including the top surface of the fifth interconnect-level dielectric material layer 650); and the non-Ohmic switching material portion 12 (comprising the non-Ohmic switching material plate 168) comprises a contoured bottom surface contacting the top surface segments of the first switch electrode 18 and the second switch electrode 10. In one embodiment, a portion of the non-Ohmic switching material portion 12 protrudes downward below a horizontal plane including the top surface segments of the first switch electrode 18 and the second switch electrode and contacts sidewall surface segments of the first switch electrode 18 and the second switch electrode 10.

FIGS. 5A-5D are sequential vertical cross-sectional views of a fifth embodiment structure during formation of a device of the present disclosure.

Figure 5A:
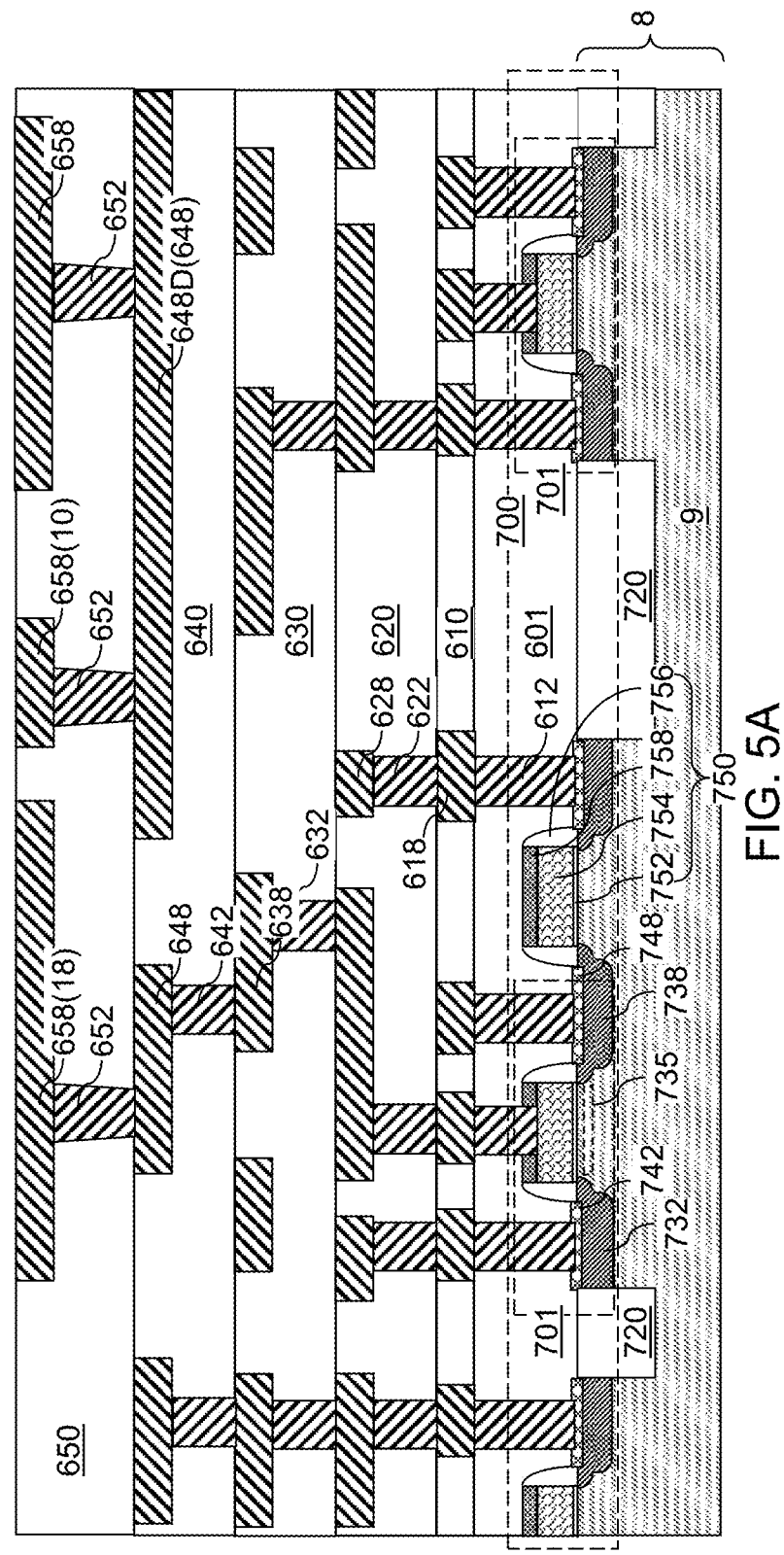
FIGS. 5A-5D are sequential vertical cross-sectional views of a fifth structure during formation of a device structure according to an embodiment of the present disclosure.

Referring to FIG. 5A, the fifth embodiment structure may be the same as the third embodiment structure illustrated in FIG. 3B.

Figure 5B:
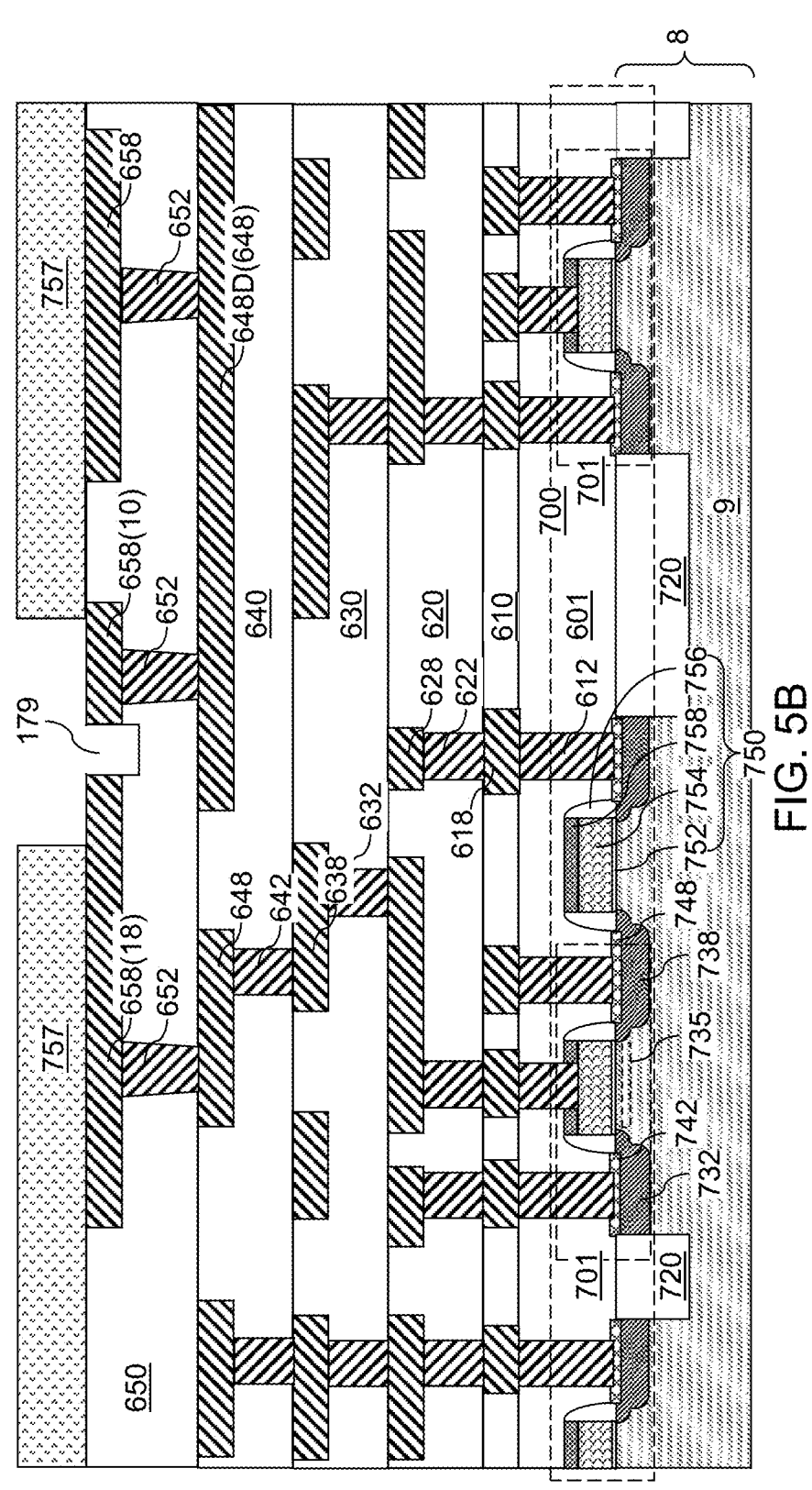

Referring to FIG. 5B, a photoresist layer 757 may be applied over the top surface of the fifth interconnect-level dielectric material layer 650 and the fifth conductive line structures 658, and may be lithographically patterned to form a discrete opening that overlie a gap between the first switch electrode 18 (which is a fifth conductive line structure 658) and a second switch electrode 10 (which is another fifth conductive line structure 658). The lateral distance between the first switch electrode 18 and the second switch electrode 10 may be adjusted to optimize the threshold voltage of a non-Ohmic switching material portion to be subsequently formed. Areas outside the areas of the combination of the first switch electrode 18, the second switch electrode 10, and the gap may be covered by the photoresist layer 757.

An etch process may be performed to remove an upper portion of the fifth interconnect-level dielectric material layer 650 that is not masked by the photoresist layer 757. The etch process may comprise an anisotropic etch process (such as a reactive ion etch process) or an isotropic etch process (such as a wet etch process). A via cavities 179 is formed within each volume from which a material of the fifth interconnect-level dielectric material layer 650 is removed. Sidewalls of the first switch electrode 18 and the second switch electrode 10 may be physically exposed around the via cavity 179. The depth of the via cavity 179 may be greater than, less than, or equal to, the height of the first switch electrode 18 and the second switch electrode 10. The photoresist layer 757 may be subsequently removed, for example, by ashing.

Figure 5C:
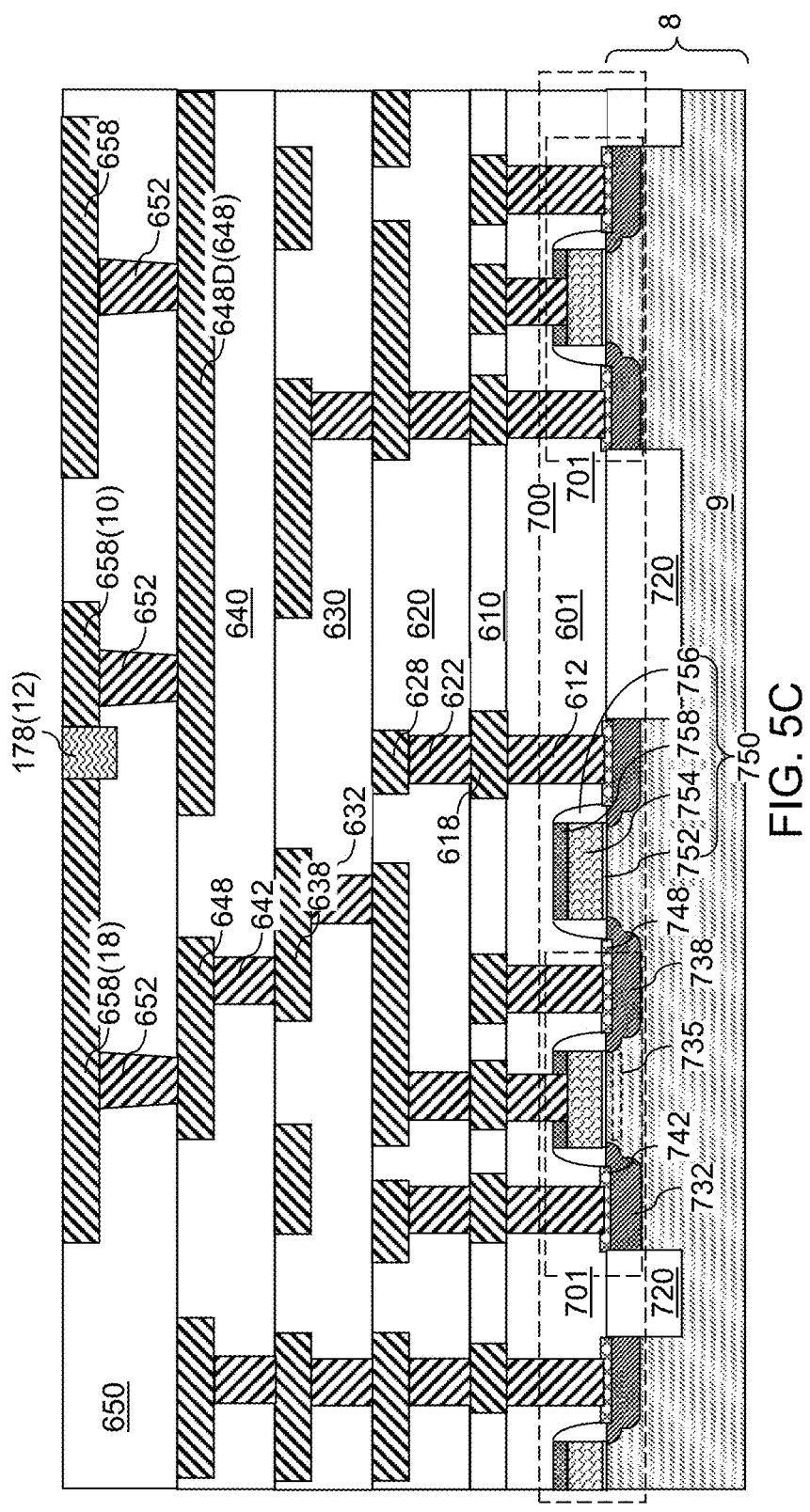

Referring to FIG. 5C, at least one non-Ohmic switching material may be deposited in the via cavity 179, and excess portions of the at least one non-Ohmic switching material may be removed from outside the via cavity 179, i.e., from above the horizontal plane including the top surface of the fifth interconnect-level dielectric material layer 650. The at least one non-Ohmic material used in the fifth embodiment structure may be any of the non-Ohmic materials that may be used for the non-Ohmic switching material portions 12 described with reference to FIG. 1D.

A remaining portion of the at least one non-Ohmic switching material that fills the via cavity 179 constitutes a non-Ohmic switching material portion 12, which is a non-Ohmic switching material via structure 178 having a bottom surface that contacts a dielectric surface of the fifth interconnect-level dielectric material layer 650. In one embodiment, the non-Ohmic switching material via structure 178 may have a horizontal top surface located entirely within the horizontal plane including the top surface of the fifth interconnect-level dielectric material layer 650. The non-Ohmic switching material via structure 178 may contact a sidewall of the first switch electrode 18 and a sidewall of the second switch electrode 10.

Generally, the lateral dimension and/or the material composition of the non-Ohmic switching material via structure 12 may be selected to optimize the threshold voltage of the non-Ohmic switching material via structure 12 for switching from an off state to an on state.

Figure 5D:
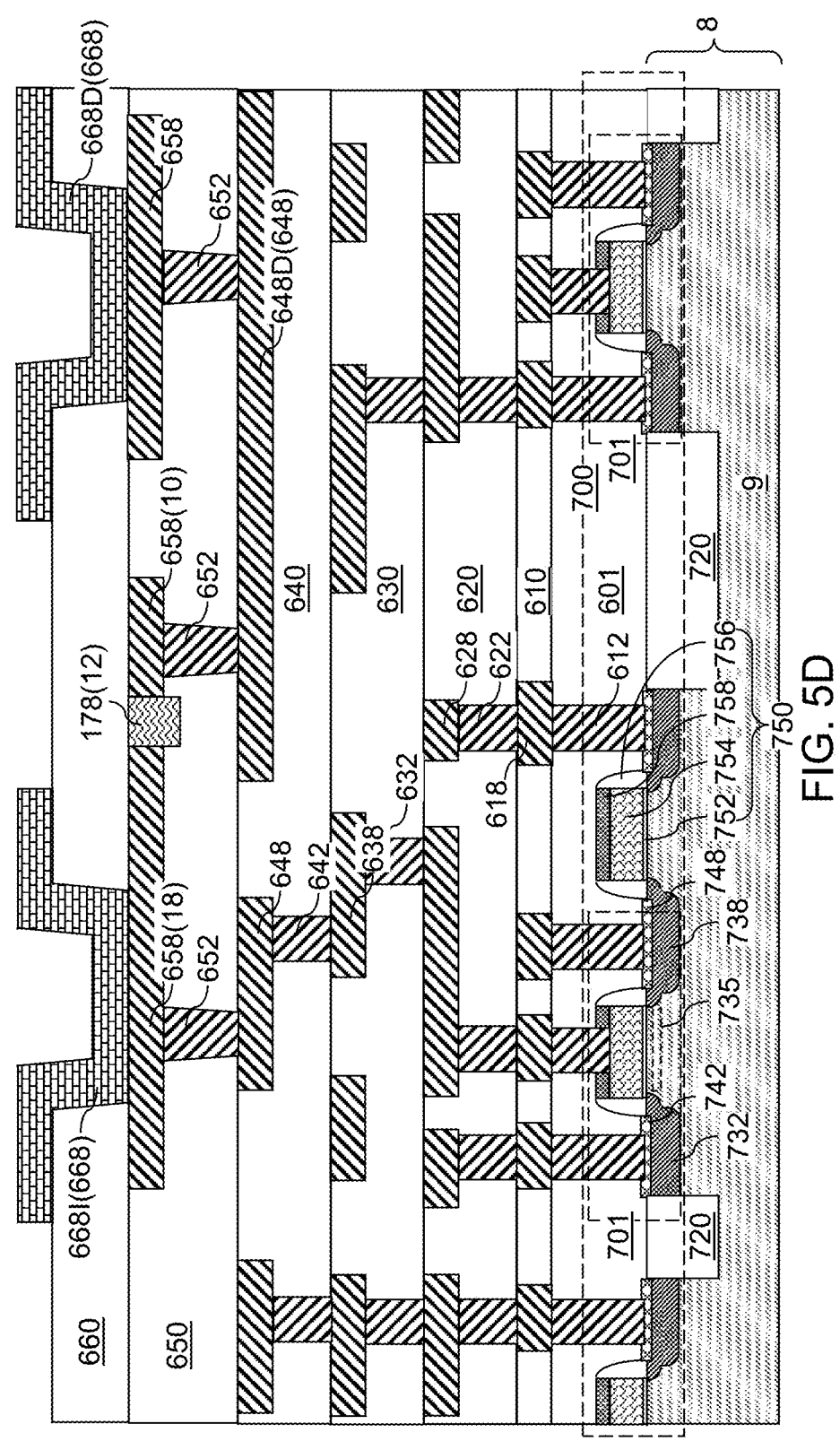

Referring to FIG. 5D, the processing steps described with reference to FIG. 1F may be performed to form a bonding-level dielectric layer 660 and metal pads 668. The metal pads 668 may comprise a signal input pad 6681 and an electrostatic discharge pad 668D.

Generally, the fifth embodiment structure may provide the same features as the third embodiment structure except that the non-Ohmic switching material portion 12 is formed as a via structure contacting sidewalls of the first switch electrode 18 and the second switch electrode 10. The top surface of the non-Ohmic switching material portion 12 (comprising the non-Ohmic switching material via structure 178) may be formed within the same horizontal plane as the top surfaces of the first switch electrode 18 and the second switch electrode 10. The threshold voltage of the non-Ohmic switching material portion 12 may be controlled by the lateral spacing between the first switch electrode 18 and the second switch electrode 10.

In one embodiment, the non-Ohmic switching material portion 12 (comprising a non-Ohmic switching material via structure 178) comprises a sidewall surface segment that contacts a first dielectric material layer (such as the fifth interconnect-level dielectric material layer 650) selected from the dielectric material layers (601, 610, 620, 630, 640, 650, 660) of the fifth embodiment structure. In one embodiment, the non-Ohmic switching material portion 12 comprises: a first additional sidewall surface segment that contacts a sidewall of the first switch electrode 18; and a second additional sidewall surface segment that contacts a sidewall of the second switch electrode 10. In one embodiment, the non-Ohmic switching material portion 12 has a top surface located at a horizontal plane including top surfaces of the first switch electrode 18 and the second switch electrode 10.

FIGS. 6A-6D are sequential vertical cross-sectional views of a sixth embodiment structure during formation of a device structure of the present disclosure.

Figure 6A:
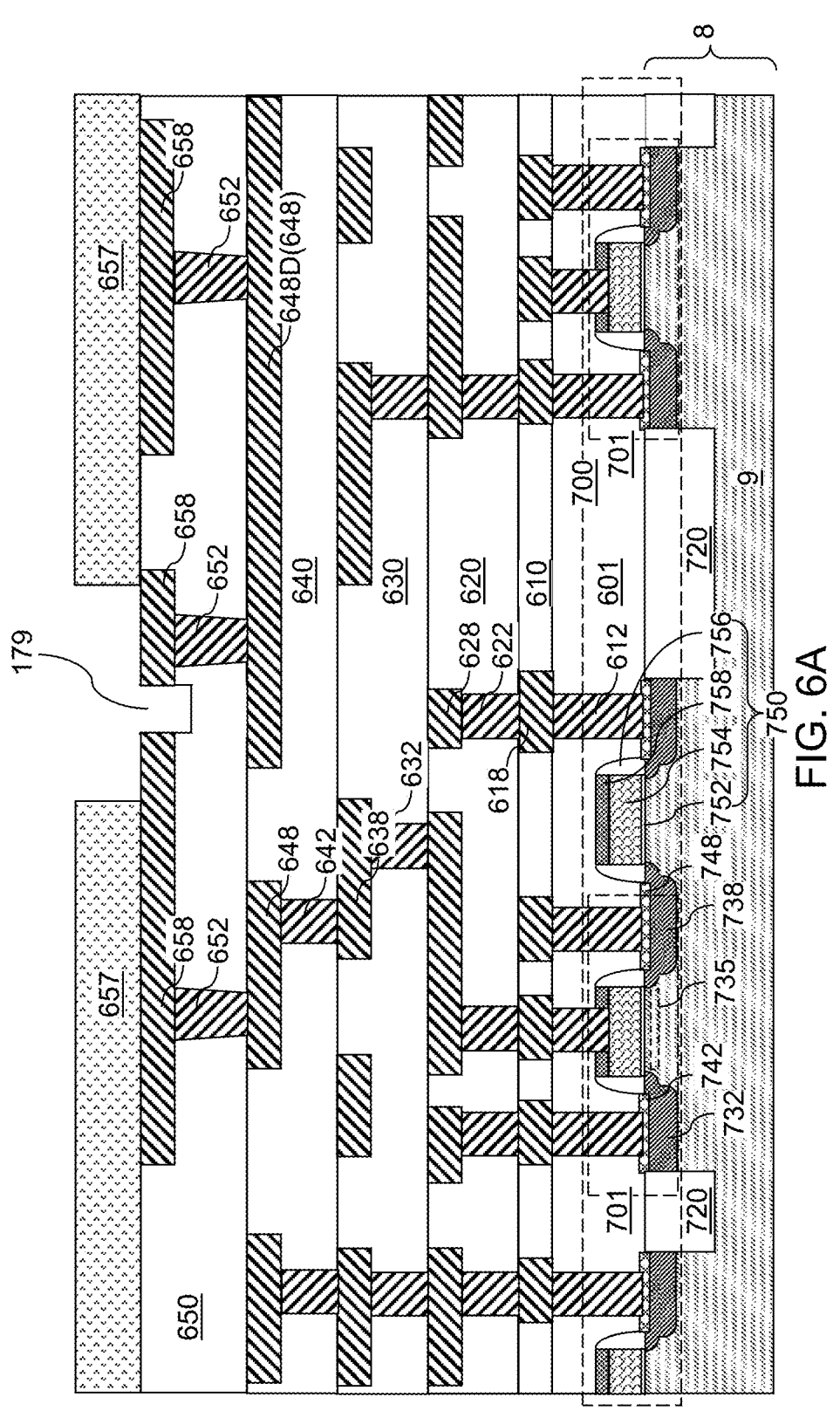
FIGS. 6A-6D are sequential vertical cross-sectional views of a sixth structure during formation of a device structure according to an embodiment of the present disclosure.

Referring to FIG. 6A, the sixth embodiment structure may be derived from the fourth embodiment structure illustrated in FIG. 4A by modifying a pattern of the masking material layer 657 to be the same as the pattern of the photoresist layer 757 in the fifth embodiment structure illustrated in FIG. 5B. Subsequently, the processing steps described with reference to FIG. 5B may be performed to form a via cavity 179. The photoresist layer 757 may be subsequently removed, for example, by ashing.

Figure 6B:
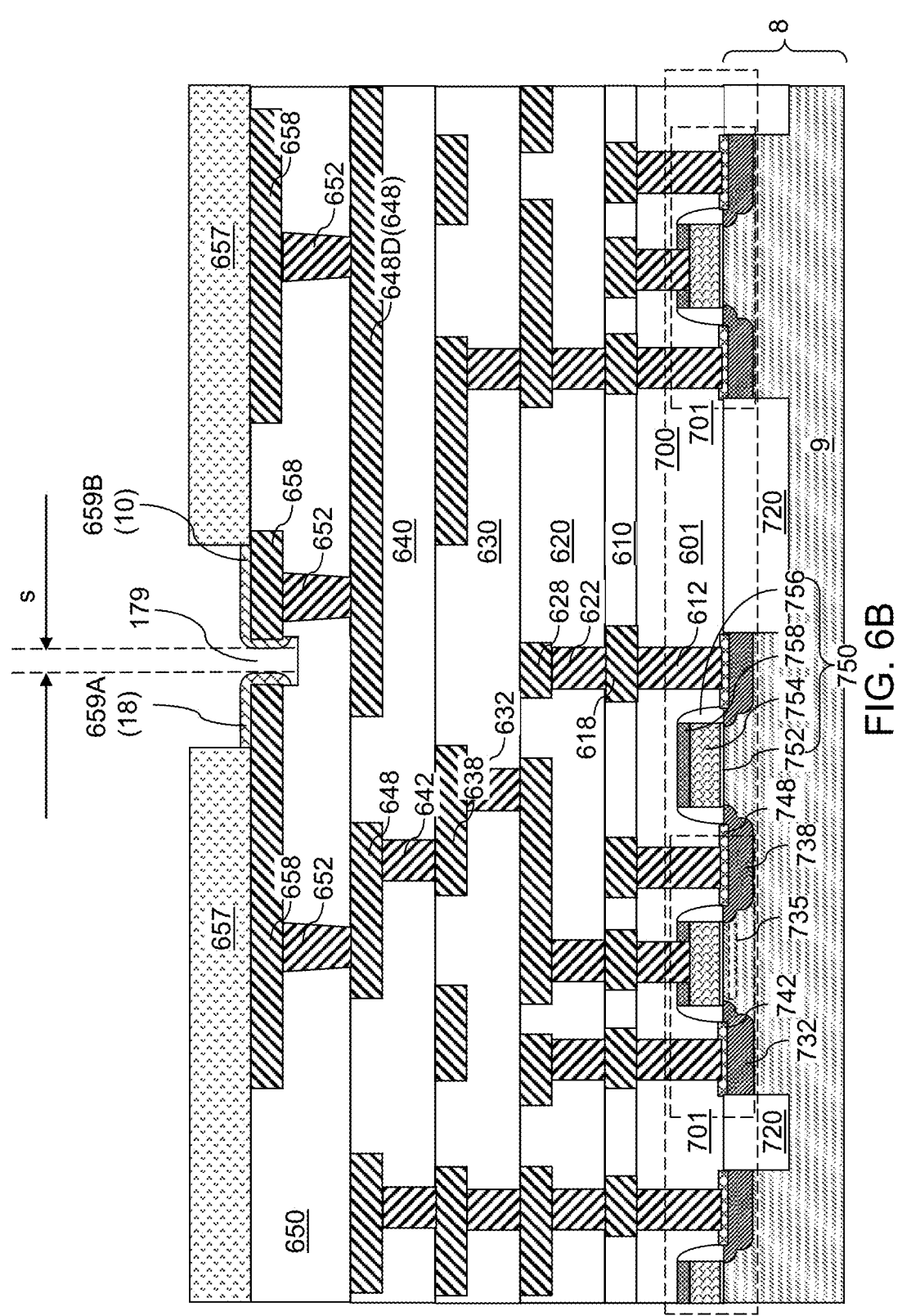

Referring to FIG. 6B, the processing steps described with reference to FIG. 4B may be performed to form a first switch electrode 18 and a second switch electrode 10 as a first metallic plate 659A and as a second metallic plate 659B, respectively. In the sixth embodiment structure, the first switch electrode 18 grows from the physically exposed top surface and the physically exposed sidewall of the conductive line structure 658 that is electrically connected to a semiconductor device 701 which needs to be protected against electrostatic discharge events. The second switch electrode 10 grows from the physically exposed top surface and the physically exposed sidewall of the conductive line structure 658 that forms an element within the electrostatic discharge path.

According to an aspect of the present disclosure, the growth of the first switch electrode 18 and the second switch electrode 10 may continue until the lateral spacing between the first switch electrode 18 and the second switch electrode 10 reaches a target spacing s, which may be in a range from 20 nm to 300 nm, such as from 40 nm to 100 nm, although lesser and greater target spacing s may also be used. The masking material layer 657 may be subsequently removed, for example, by ashing or by a wet etch process.

Figure 6C:
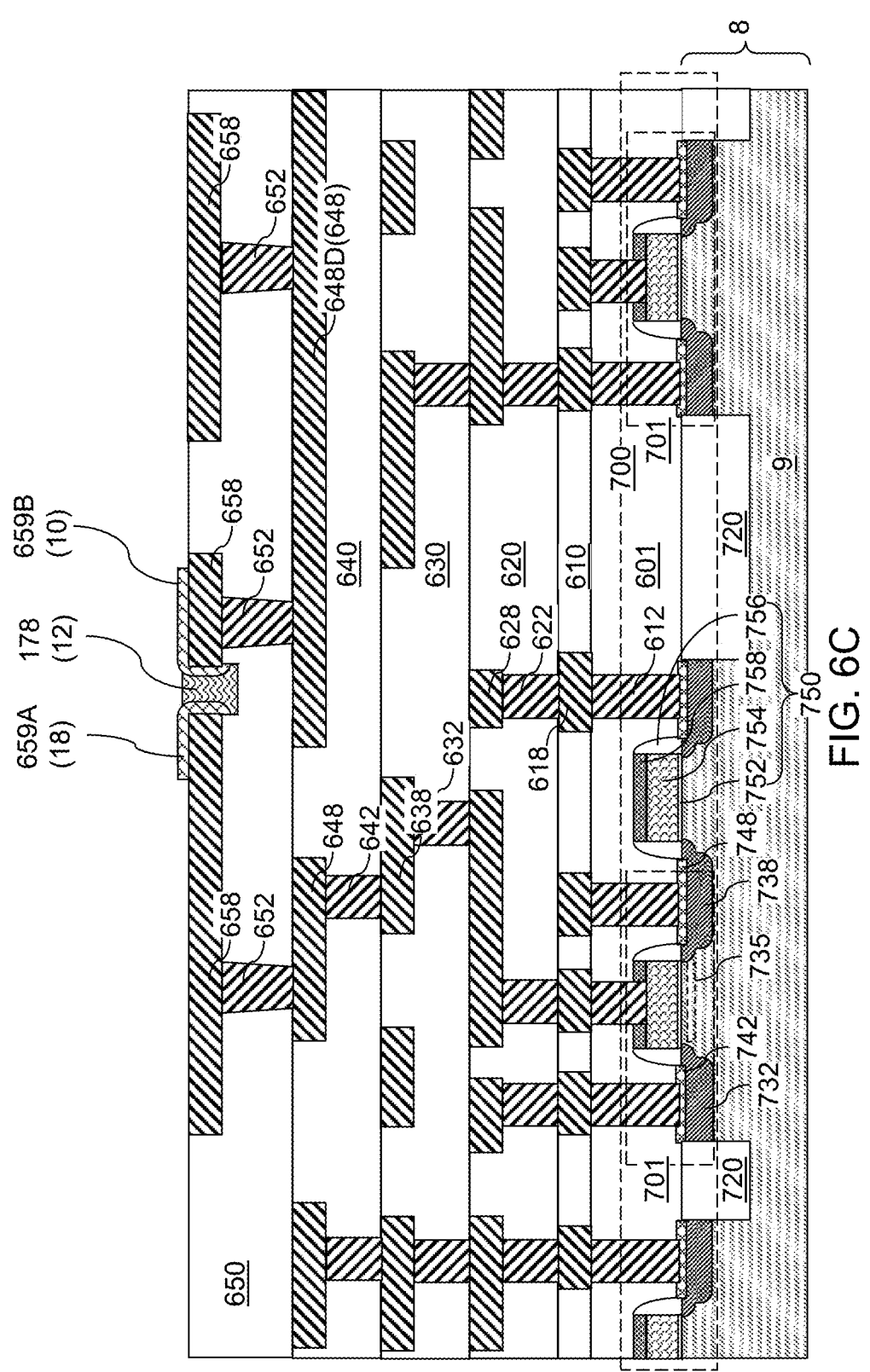

Referring to FIG. 6C, at least one non-Ohmic switching material may be deposited in the via cavity 179, and excess portions of the at least one non-Ohmic switching material may be removed from outside the via cavity 179 by performing a planarization process. The planarization process may comprise a chemical mechanical polishing process and/or a recess etch process. The at least one non-Ohmic material used in the sixth embodiment structure may be any of the non-Ohmic materials that may be used for the non-Ohmic switching material portions 12 described with reference to FIG. 1D.

A remaining portion of the at least one non-Ohmic switching material that fills the via cavity 179 constitutes a non-Ohmic switching material portion 12, which is a non-Ohmic switching material via structure 178 having a bottom surface that contacts a dielectric surface of the fifth interconnect-level dielectric material layer 650. In one embodiment, the non-Ohmic switching material via structure 178 may have a horizontal top surface located entirely above, below, or at, the horizontal plane including the top surface of the fifth interconnect-level dielectric material layer 650 depending on the recess depth of the non-Ohmic switching material via structure 178 during the planarization process. The non-Ohmic switching material via structure 178 may contact a sidewall of the first switch electrode 18 and a sidewall of the second switch electrode 10.

Generally, the lateral dimension and/or the material composition of the non-Ohmic switching material via structure 12 may be selected to optimize the threshold voltage of the non-Ohmic switching material via structure 12 for switching from an off state to an on state.

Figure 6D:
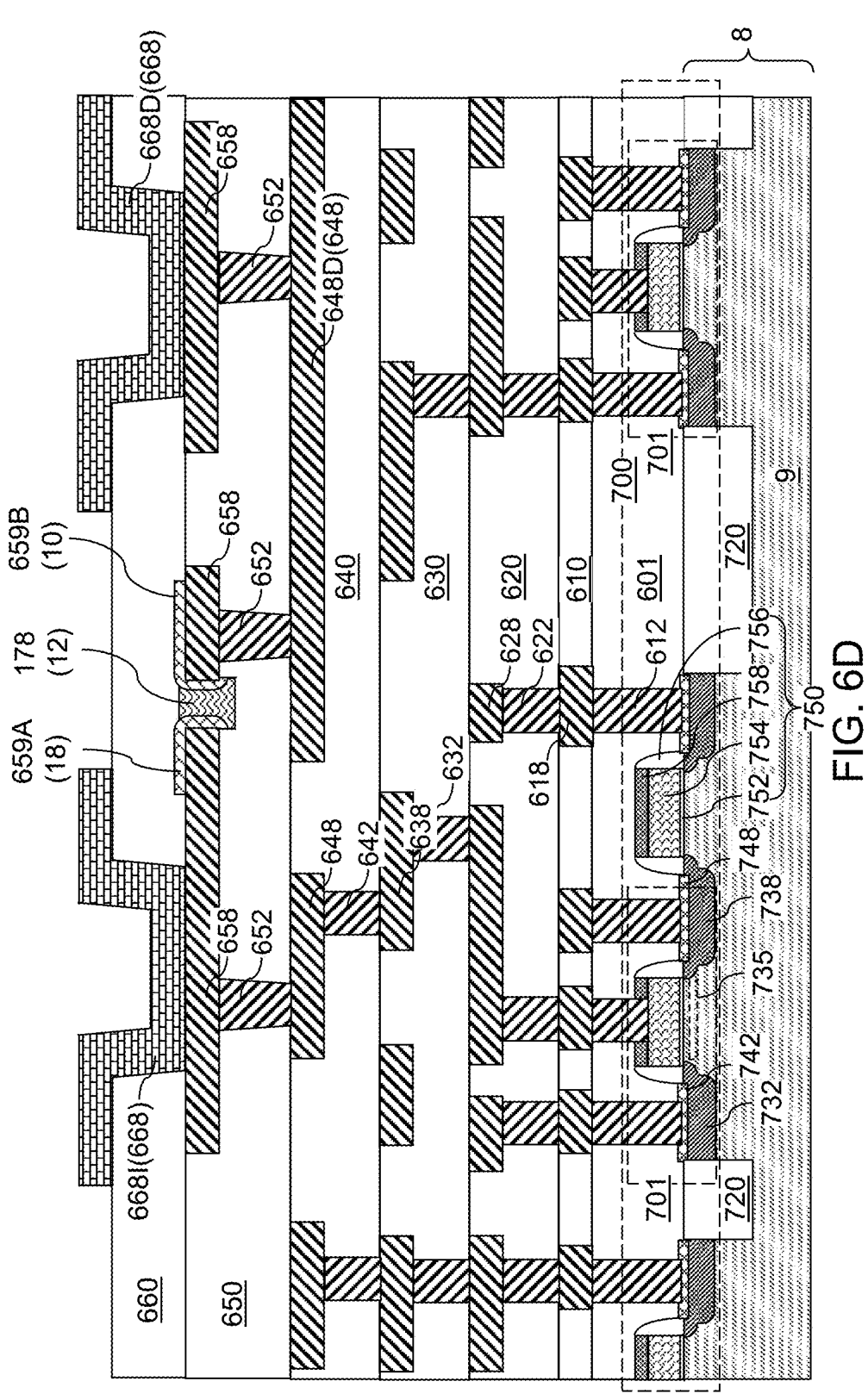

Referring to FIG. 6D, the processing steps described with reference to FIG. 1F may be performed to form a bonding-level dielectric layer 660 and metal pads 668. The metal pads 668 may comprise a signal input pad 6681 and an electrostatic discharge pad 668D.

Generally, the sixth embodiment structure may provide the same features as the fourth embodiment structure except that the non-Ohmic switching material portion 12 is formed as a via structure contacting sidewalls of the first switch electrode 18 and the second switch electrode 10. The top surface of the non-Ohmic switching material portion 12 (comprising the non-Ohmic switching material via structure 178) may be formed within, or below, the horizontal plane as the top surfaces of the first switch electrode 18 and the second switch electrode 10. The threshold voltage of the non-Ohmic switching material portion 12 may be controlled by the lateral spacing between the first switch electrode 18 and the second switch electrode 10.

In one embodiment, the non-Ohmic switching material portion 12 (comprising a non-Ohmic switching material via structure 178) comprises a sidewall surface segment that contacts a first dielectric material layer (such as the fifth interconnect-level dielectric material layer 650) selected from the dielectric material layers (601, 610, 620, 630, 640, 650, 660) of the fifth embodiment structure. In one embodiment, the non-Ohmic switching material portion 12 comprises: a first additional sidewall surface segment that contacts a sidewall of the first switch electrode 18; and a second additional sidewall surface segment that contacts a sidewall of the second switch electrode 10. In one embodiment, the non-Ohmic switching material portion 12 has a top surface located at, or below, a horizontal plane including top surfaces of the first switch electrode 18 and the second switch electrode 10.

Referring collectively to FIGS. 1A-6D, a contiguous combination of a first switch electrode 18, a second switch electrode 10, and a non-Ohmic switching material portion 12 constitutes an electrostatic discharge (ESD) switch. Generally, an electrostatic discharge (ESD) switch may be formed over the first dielectric material layers (601, 610, 620, 630, 640). The ESD switch comprises a first switch electrode 18 that is electrically connected to one of the semiconductor devices 701 through a subset of the metal interconnect structures (612, 618, 622, 628, 632, 638, 642, 648), a second switch electrode 10 that is electrically isolated from the semiconductor device 701, and a non-Ohmic switching material portion 12 providing a non-Ohmic current-voltage characteristics and in contact with the first switch electrode 18 and the second switch electrode 10. The non-Ohmic switching material portion 12 comprises an ovonic threshold material or a phase change memory material. An electrostatic discharge line (such as an electrostatic discharge line 648D illustrated in FIG. 1F and 2D or comprising conductive line structures electrically connected to the electrostatic discharge pad 668D in other embodiments) may be electrically connected to the second switch electrode 10.

Figure 7:
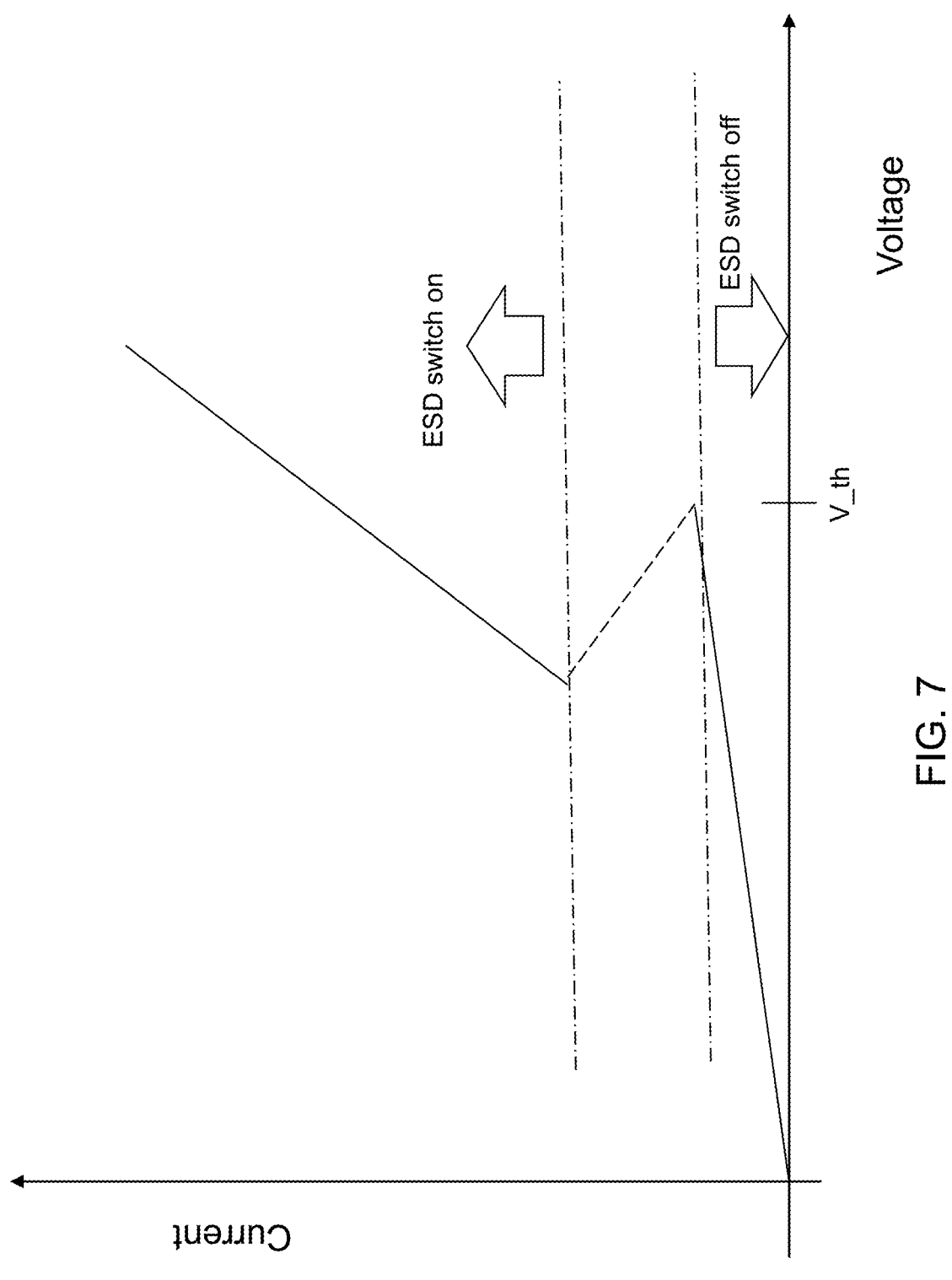
FIG. 7 is graph illustrating current-voltage characteristics of a non-Ohmic switching device of the present disclosure.

Referring to FIG. 7, a graph illustrates current-voltage characteristics of a non-Ohmic voltage-triggered switch (18, 12, 10) of the present disclosure, which may be used as an electrostatic discharge (ESD) switch. The non-Ohmic voltage-triggered switch (18, 12, 10) of the present disclosure functions as a passive self turn-on device which turns on upon application of an external voltage pulse having a magnitude that exceeds the threshold voltage $V\_th$ of the non-Ohmic switching material portion 12. The threshold voltage $V\_th$ may be in a range from 3 V to 50 V, such as from 5 V to 30 V, and/or 8 V to 15 V, although lesser and greater voltages may also be used.

Generally, the non-Ohmic voltage-triggered switch (18, 12, 10) comprises a first switch electrode 18 that is electrically connected to one of the semiconductor devices 701 through a subset of the metal interconnect structures (612, 618, 622, 628, 632, 638, 642, 648), a second switch electrode 10, and a non-Ohmic switching material portion 12 providing a non-Ohmic current-voltage characteristics and in contact with the first switch electrode 18 and the second switch electrode 10. The non-Ohmic voltage-triggered switch (18, 12, 10) of the present disclosure functions as a high resistance resistor when the applied external voltage does not exceed the threshold voltage V_th. Once the magnitude of the applied external voltage exceeds the threshold voltage V_th, the non-Ohmic voltage-triggered switch (18, 12, 10) transitions into an on-state, i.e., a low resistance state, which provides a high conductivity and effectively functions as a conductor.

Various mechanisms may be used for the transition between the high resistance state and the low resistance state of the non-Ohmic voltage-triggered switch (18, 12, 10). The present disclosure is not limited by any particular operating mechanism of a non-Ohmic switching material.

Figure 8:
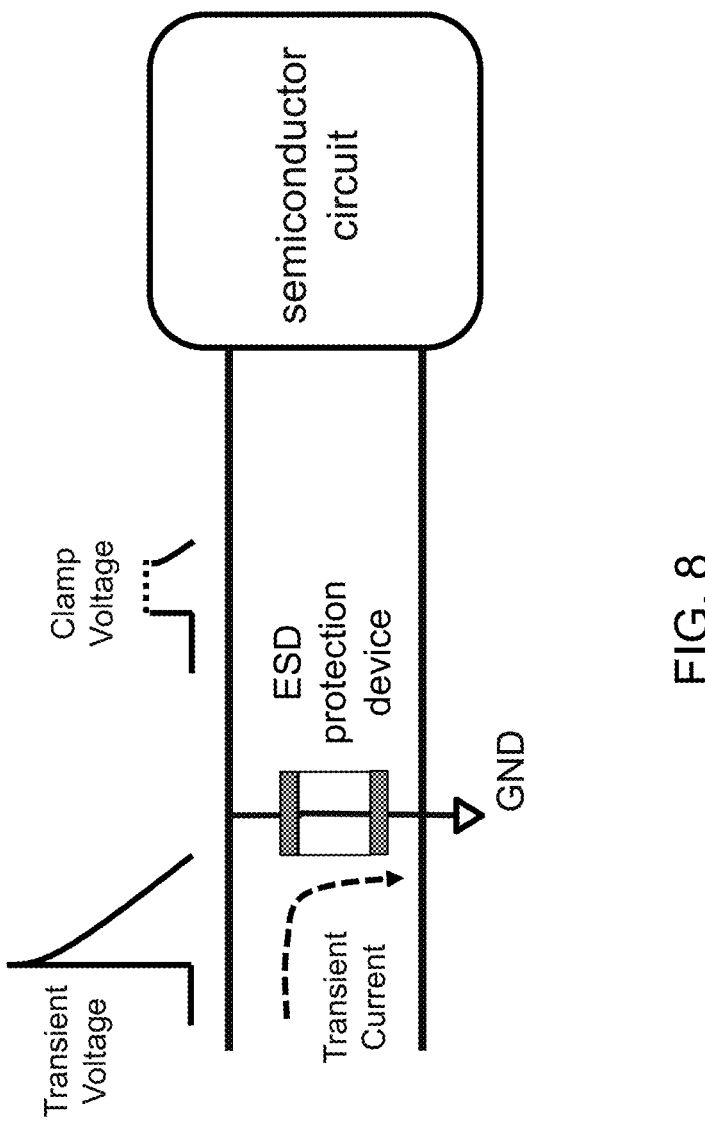
FIG. 8 is a schematic diagram illustrating operation of the non-Ohmic switching device of the present disclosure as an electrostatic discharge (ESD) switch according to an embodiment of the present disclosure.

Referring to FIG. 8, operation of the non-Ohmic voltage-triggered switch (18, 12, 10) of the present disclosure as an electrostatic discharge (ESD) switch is illustrated. The non-Ohmic voltage-triggered switch (18, 12, 10), which functions as an ESD protection device, is normally in an off state, and does not affect operation of the semiconductor circuit. In instances in which a transient voltage having a magnitude grater than the threshold voltage of the non-Ohmic voltage-triggered switch (18, 12, 10) is applied across the non-Ohmic voltage-triggered switch (18, 12, 10), the non-Ohmic voltage-triggered switch (18, 12, 10) is turned on, i.e., transitions into a low resistivity state. A transient current flows through the non-Ohmic voltage-triggered switch (18, 12, 10), and may be directed to electrical ground or a negative power supply voltage V_ss through the electrostatic discharge line. The input voltage that is transmitted to the semiconductor circuit is clamped at the threshold voltage of the non-Ohmic voltage-triggered switch (18, 12, 10). As such, the input voltage that is transmitted to the semiconductor circuit is clamped at the threshold voltage of the non-Ohmic voltage-triggered switch (18, 12, 10), and thus, the semiconductor devices in the semiconductor circuit is protected.

The non-Ohmic voltage-triggered switch (18, 12, 10) of the present disclosure is a passive circuit that does not require any control device (such as a field effect transistor). Generally, a switch transistor that can handle a large current such as the transient current during an ESD event requires a large area. As used herein, an ESD event refers to any transient charge event including all ESD events and potential-induced degradation (PID) events. Thus, an ESD protection scheme using field effect transistors requires a large device area for a control transistor. The non-Ohmic voltage-triggered switch (18, 12, 10) of the present disclosure does not require any transistor, and may be constructed entirely within dielectric material layers as a back-end-of-line structure. As such, the non-Ohmic voltage-triggered switch (18, 12, 10) may provide area-efficient ESD protection.

FIG. 9 is a flowchart that illustrates general processing steps for manufacturing a device structure according to an embodiment of the present disclosure.

Referring to step 910 and FIG. 1A, semiconductor device 701 may be formed on a substrate 8.

Referring to step 920 and FIG. 1A, forming first metal interconnect structures (612, 618, 622, 628, 632, 638, 642, 648) and first dielectric material layers (601, 610, 620, 630, 640) may be formed over the semiconductor device 701.

Referring to step 930 and FIGS. 1B-1E, 2A-2C, 3A-3C, 4A-4C, 5A-5C, and 6A-6C, an electrostatic discharge (ESD) switch (18, 12, 10) may be formed over the first dielectric material layers (601, 610, 620, 630, 640). The ESD switch (18, 12, 10) comprises a first switch electrode 18 that is electrically connected to one of the semiconductor devices 701 through a subset of the metal interconnect structures (612, 618, 622, 628, 632, 638, 642, 648), a second switch electrode 10 that is electrically isolated from the semiconductor device 701, and a non-Ohmic switching material portion 12 providing a non-Ohmic current-voltage characteristics and in contact with the first switch electrode 18 and the second switch electrode 10. In one embodiment, the non-Ohmic switching material portion 12 comprises an ovonic threshold material or a phase change memory material.

Referring to step 940 and to FIGS. 1F, 2D, 3D, 4D, 5D, and 6D, an electrostatic discharge line may be formed. The electrostatic discharge line is electrically connected to the second switch electrode 10. The electrostatic discharge line may be used as any set of metal interconnect structures that is electrically connected (i.e., electrically shorted) to an electrostatic discharge pad 668D or any alternative electrostatic discharge structure such as an electrostatic discharge line, an electrostatic discharge plate, an electrostatic discharge metallic frame, etc.

Referring to all drawings and according to various embodiments of the present disclosure, a device structure is provided, which comprises: semiconductor devices 701 located on a substrate 8; metal interconnect structures (612, 618, 622, 628, 632, 638, 642, 648) located in dielectric material layers (601, 610, 620, 630, 640, 650, 660) overlying the semiconductor devices 701; and a non-Ohmic voltage-triggered switch (18, 12, 10) comprising a first switch electrode 18 that is electrically connected to one of the semiconductor devices 701 through a subset of the metal interconnect structures (612, 618, 622, 628, 632, 638, 642, 648), a second switch electrode 10, and a non-Ohmic switching material portion 12 electrically connected to the first switch electrode 18 and the second switch electrode 10, wherein the non-Ohmic switching material portion 12 may be configured to provide non-Ohmic current-voltage characteristics.

In one embodiment, the non-Ohmic switching material portion 12 comprises a sidewall surface segment that contacts a first dielectric material layer selected from the dielectric material layers (601, 610, 620, 630, 640, 650, 660).

In one embodiment, the first switch electrode 18 contacts a top surface of the non-Ohmic switching material portion 12; and the second switch electrode 10 contacts a bottom surface of the non-Ohmic switching material portion 12.

In one embodiment, the non-Ohmic switching material portion 12 comprises a via structure 652; and an entirety of the top surface of the non-Ohmic switching material portion 12 is in contact with a segment of a bottom surface of the first switch electrode 18.

In one embodiment, the non-Ohmic switching material portion 12 comprises a via liner 162 located in a peripheral portion of a via opening 159; and the second switch electrode 10 comprises a portion located in an inner portion of the via opening 159 and contacting an inner sidewall of the via liner 162.

In one embodiment, the first switch electrode 18 and the second switch electrode 10 have top surface segments located within a horizontal plane; and the non-Ohmic switching material portion 12 comprises a bottom surface contacting the top surface segments of the first switch electrode 18.

In one embodiment, an entirety of the non-Ohmic switching material portion 12 has a uniform vertical thickness throughout.

In one embodiment, a portion of the non-Ohmic switching material portion 12 protrudes downward below a horizontal plane including the top surface segments of the first switch electrode 18 and the second switch electrode and contacts sidewall surface segments of the first switch electrode 18 and the second switch electrode 10.

In one embodiment, the non-Ohmic switching material portion 12 comprises: a first additional sidewall surface segment that contacts a sidewall of the first switch electrode 18; and a second additional sidewall surface segment that contacts a sidewall of the second switch electrode 10.

In one embodiment, the non-Ohmic switching material portion 12 has a top surface located at, or below, a horizontal plane including top surfaces of the first switch electrode 18 and the second switch electrode 10.

In one embodiment, the non-Ohmic switching material portion 12 comprises an ovonic threshold material or a phase change memory material.

According to another aspect of the present disclosure, a device structure is provided, which comprises: semiconductor device 701 located on a substrate 8; first metal interconnect structures (612, 618, 622, 628, 632, 638, 642, 648) located in first dielectric material layers (601, 610, 620, 630, 640) overlying the semiconductor devices 701; an electrostatic discharge line (which may be an electrostatic discharge pad 668D or any alternative electrostatic discharge structure such as an electrostatic discharge line, an electrostatic discharge plate, an electrostatic discharge metallic frame, etc.) overlying the first dielectric material layers (601, 610, 620, 630, 640); and an electrostatic discharge (ESD) switch overlying the first dielectric material layers (601, 610, 620, 630, 640) comprising a first switch electrode 18 that is electrically connected to one of the semiconductor devices 701 through a subset of the metal interconnect structures (612, 618, 622, 628, 632, 638, 642, 648), a second switch electrode 10 that is electrically connected to the electrostatic discharge line 668D, and a non-Ohmic switching material portion 12 providing a non-Ohmic current-voltage characteristics and in contact with the first switch electrode 18 and the second switch electrode 10, wherein the non-Ohmic switching material portion 12 comprises an ovonic threshold material or a phase change memory material.

In one embodiment, the second switch electrode 10 comprises a first conductive line; the first switch electrode 18 comprises a second conductive line; and the non-Ohmic switching material portion 12 comprises a via structure 152 that is laterally surrounded by a second dielectric material layer that overlies the first dielectric material layers (601, 610, 620, 630, 640) and contacts a bottom surface of the first switch electrode 18 and contacts a top surface of the second switch electrode 10.

In one embodiment, the second switch electrode 10 comprises a first conductive line; the non-Ohmic switching material portion 12 comprises a via liner 162 located in a peripheral portion of a via opening 159 in a second dielectric material layer that overlies the first dielectric material layers (601, 610, 620, 630, 640); and the first switch electrode 18 comprises a second conductive line including a downward protruding portion located in an inner portion of the via opening 159 and contacting an inner sidewall of the via liner 162.

In one embodiment, the first switch electrode 18 and the second switch electrode 10 comprise conductive lines that overlie the first dielectric material layers (601, 610, 620, 630, 640) and having top surface segments located within a horizontal plane; and the non-Ohmic switching material portion 12 comprises a plate structure 168 or a via structure 152 located between the first switch electrode 18 and the second switch electrode 10.

In one embodiment, the first switch electrode 18 and the second switch electrode 10 comprise metal plates (659A, 659B) located on a respective conductive line that overlie the first dielectric material layers (601, 610, 620, 630, 640); and the non-Ohmic switching material portion 12 contacts sidewalls of the first switch electrode 18 and the second switch electrode 10.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
   semiconductor devices located on a substrate;
   metal interconnect structures located in dielectric material layers overlying the semiconductor devices, wherein the metal interconnect structures comprise:
   a first conductive line structure; and
   a second conductive line structure, wherein:
      the first conductive line structure and the second conductive line structure are formed within a first dielectric material layer selected from the dielectric material layers and are spaced by a gap therebetween;
      a first sidewall of the first conductive line structure and a second sidewall of the second conductive line structure face the gap;
      top surfaces of the first conductive line structure and the second conductive line structure are located within a horizontal plane including a top surface of the first dielectric material layer;
      a volume of a via cavity which is not filled with the first dielectric material layer, the first conductive line structure, or the second conductive line structure is present in the gap, the volume of the via cavity being defined by, and bounded by, the first sidewall of the first conductive line structure, the second sidewall of the second conductive line structure, sidewalls of the first dielectric material layer, a recessed surface of the first dielectric material layer, and the horizontal plane; and
      one of the sidewalls of the first dielectric material layer vertically extends downward from the first sidewall to the recessed surface and another of the sidewalls of the first dielectric material layer vertically extends downward from the second sidewall to the recessed surface; and a non-Ohmic voltage-triggered switch comprising:

a first switch electrode that comprises the first conductive line structure and is electrically connected to one of the semiconductor devices through a subset of the metal interconnect structures;

a second switch electrode that comprises the second conductive line structure; and a non-Ohmic switching material portion located at least partly within the volume of the via cavity and contacting the recessed surface of the first dielectric material layer and electrically connected to the first switch electrode and the second switch electrode, wherein the non-Ohmic switching material portion has non-Ohmic current-voltage characteristics.

2. The device structure of claim 1, wherein the non-Ohmic switching material portion comprises a sidewall surface segment that contacts said one of the sidewalls of the first dielectric material layer.

3. The device structure of claim 2, wherein the non-Ohmic switching material portion comprises:

a first additional sidewall surface segment that contacts a sidewall of the first switch electrode; and a second additional sidewall surface segment that contacts a sidewall of the second switch electrode.

4. The device structure of claim 3, wherein the non-Ohmic switching material portion has a top surface located at, or below, a horizontal plane including top surfaces of the first switch electrode and the second switch electrode.

5. The device structure of claim 1, wherein the non-Ohmic switching material portion comprises an ovonic threshold material or a phase change memory material.

6. A device structure comprising:

semiconductor devices located on a substrate;

metal interconnect structures located in dielectric material layers overlying the semiconductor devices, wherein the metal interconnect structures comprise:

a first conductive line structure; and a second conductive line structure, wherein:

the first conductive line structure and the second conductive line structure are formed within a first dielectric material layer selected from the dielectric material layers and are spaced by a gap therebetween;

a first sidewall of the first conductive line structure and a second sidewall of the second conductive line structure face the gap;

top surfaces of the first conductive line structure and the second conductive line structure are located within a horizontal plane including a top surface of the first dielectric material layer;

a volume of a via cavity which is not filled with the first dielectric material layer, the first conductive line structure, or the second conductive line structure is present in the gap, the volume of the via cavity being defined by, and bounded by, the first sidewall of the first conductive line structure, the second sidewall of the second conductive line structure, sidewalls of the first dielectric material layer, a recessed surface of the first dielectric material layer, and the horizontal plane; and one of the sidewalls of the first dielectric material layer vertically extends downward from the first sidewall to the recessed surface and another of the sidewalls of the first dielectric material layer vertically extends downward from the second sidewall to the recessed surface;

an electrostatic discharge line overlying the first dielectric material layers; and an electrostatic discharge (ESD) switch overlying the first dielectric material layers comprising:

a first switch electrode that comprises the first conductive line structure and is electrically connected to one of the semiconductor devices through a subset of the metal interconnect structures;

a second switch electrode that comprises the second conductive line structure and is electrically connected to the electrostatic discharge line; and a non-Ohmic switching material portion that has non-Ohmic current-voltage characteristics and is in contact with the first switch electrode and the second switch electrode and is located at least partly within the volume of the via cavity and contacts the recessed surface of the first dielectric material layer, wherein the non-Ohmic switching material portion comprises an ovonic threshold material or a phase change memory material.

7. The device structure of claim 6, wherein:

the first switch electrode and the second switch electrode further comprise metal plates located on a respective one of the first conductive line structure and the second conductive line structure; and the non-Ohmic switching material portion contacts sidewalls of the first switch electrode and the second switch electrode.

8. A device structure comprising:

semiconductor devices located on a substrate;

metal interconnect structures located in dielectric material layers overlying the semiconductor devices, wherein the metal interconnect structures comprise:

a first conductive line structure; and a second conductive line structure, wherein:

the first conductive line structure and the second conductive line structure are formed within a first dielectric material layer selected from the dielectric material layers and are spaced by a gap therebetween;

a first sidewall of the first conductive line structure and a second sidewall of the second conductive line structure face the gap;

top surfaces of the first conductive line structure and the second conductive line structure are located within a horizontal plane including a top surface of the first dielectric material layer;

a volume of a via cavity which is not filled with the first dielectric material layer, the first conductive line structure, or the second conductive line structure is present in the gap, the volume of the via cavity being defined by, and bounded by, the first sidewall of the first conductive line structure, the second sidewall of the second conductive line structure, sidewalls of the first dielectric material layer, a recessed surface of the first dielectric material layer, and the horizontal plane; and one of the sidewalls of the first dielectric material layer vertically extends downward from the first sidewall to the recessed surface and another of the sidewalls of the first dielectric material layer vertically extends downward from the second sidewall to the recessed surface;

a first switch electrode that comprises the first conductive line structure and is electrically connected to one of the semiconductor devices through a subset of the metal interconnect structures;

a second switch electrode that comprises the second conductive line structure; and a non-Ohmic switching material portion having a non-Ohmic current-voltage characteristics and in contact with the first switch electrode and the second switch electrode and located at least partly within the volume of the via cavity and in contact with the recessed surface of the first dielectric material layer, wherein the non-Ohmic switching material portion comprises an ovonic threshold material or a phase change memory material and is embedded in one of the dielectric material layers.

9. The device structure of claim 8, wherein the non-Ohmic switching material portion comprises a non-Ohmic switching material via structure having a bottom surface that contacts a dielectric surface of one of the dielectric material layers.

10. The device structure of claim 9, wherein the non-Ohmic switching material via structure comprises a first additional sidewall surface segment that contacts a sidewall of the first switch electrode and a second additional sidewall surface segment that contacts a sidewall of the second switch electrode.

11. The device structure of claim 8, wherein:

the first switch electrode further comprises a first metal plate located on a top surface and a sidewall of a first conductive line structure; and the second switch electrode further comprises a second metal plate located on a top surface and a sidewall of a second conductive line structure.

12. The device structure of claim 11, wherein the first metal plate and the second metal plate comprise an electroplatable metallic material selectively located on the conductive line structures.

13. The device structure of claim 8, wherein the non-Ohmic switching material portion has a top surface located at, or below, a horizontal plane including top surfaces of the first switch electrode and the second switch electrode.

14. The device structure of claim 8, wherein the first switch electrode and the second switch electrode further comprise a metallic material selectively disposed on physically exposed surfaces of the first conductive line structure and the second conductive line structure underlying conductive line structures.

15. The device structure of claim 8, further comprising an electrostatic discharge line electrically connected to the second switch electrode, wherein the electrostatic discharge line is a component of an electrostatic discharge path.

16. The device structure of claim 1, wherein:

the first switch electrode comprises a first metal plate located on the top surface and the first sidewall of the first conductive line structure; and the second switch electrode comprises a second metal plate located on the top surface and the second sidewall of the second conductive line structure.

17. The device structure of claim 1, wherein the non-Ohmic switching material portion comprises a non-Ohmic switching material via structure having a bottom surface that contacts the recessed surface of the first dielectric material layer and a first additional sidewall surface segment that contacts the first sidewall of the first switch electrode and a second additional sidewall surface segment that contacts the second sidewall of the second switch electrode.

18. The device structure of claim 6, wherein:

the first switch electrode comprises a first metal plate located on the first conductive line structure; and the second switch electrode comprises a second metal plate located on the second conductive line structure.

19. The device structure of claim 6, wherein the non-Ohmic switching material portion comprises a non-Ohmic switching material via structure having a bottom surface that contacts the recessed surface of the first dielectric material layer and a first additional sidewall surface segment that contacts the first sidewall of the first switch electrode and a second additional sidewall surface segment that contacts the second sidewall of the second switch electrode.

20. The device structure of claim 6, wherein the non-Ohmic switching material portion comprises a non-Ohmic switching material via structure located within the volume of the via cavity and having a horizontal top surface.

* * * * *